(12) United States Patent
Koide

(10) Patent No.: US 11,754,897 B2
(45) Date of Patent: Sep. 12, 2023

(54) LIQUID CRYSTAL DISPLAY

(71) Applicant: Japan Display Inc., Tokyo (JP)

(72) Inventor: Gen Koide, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/841,971

(22) Filed: Jun. 16, 2022

(65) Prior Publication Data

US 2022/0317533 A1    Oct. 6, 2022

Related U.S. Application Data

(63) Continuation of application No. 17/201,554, filed on Mar. 15, 2021, now Pat. No. 11,372,296, which is a (Continued)

(30) Foreign Application Priority Data

Jan. 21, 2013 (JP) .................................. 2013-008822

(51) Int. Cl.
*G02F 1/1362* (2006.01)
*G02F 1/1368* (2006.01)
(Continued)

(52) U.S. Cl.
CPC ...... *G02F 1/136286* (2013.01); *G02F 1/1368* (2013.01); *G02F 1/133514* (2013.01); (Continued)

(58) Field of Classification Search
CPC ......... G02F 1/136286; G02F 1/133514; G02F 1/134336; G02F 1/1368; G02F 1/13606; (Continued)

(56) References Cited

U.S. PATENT DOCUMENTS 6,936,848 B2   8/2005   Sun et al.
7,554,630 B2   6/2009   Kwon et al.
(Continued)

FOREIGN PATENT DOCUMENTS

JP   09-297303      11/1997
JP   2005-284255   10/2005
(Continued)

OTHER PUBLICATIONS

Japanese Office Action dated Dec. 1, 2015 in corresponding Japanese Application No. 2013-008822.

*Primary Examiner* — Nathanael R Briggs
(74) *Attorney, Agent, or Firm* — K&L Gates LLP

(57) ABSTRACT

A liquid crystal display is provided and includes first and second substrates and liquid crystal layer therebetween; pixel electrode on first substrate; pedestal metal coupled to pixel electrode; semiconductor layer substantially U-shaped and coupled to pedestal metal at first coupling portion; scan line that extends in first direction and in layer different from semiconductor layer; signal line that extends in second direction different from first direction so as to three-dimensionally cross scan line, signal line being coupled to semiconductor layer at second coupling portion; and extending portion that is part of scan line and that protrudes from scan line, the extending portion extending along signal line, wherein: in first direction along a shorter side of each pixel unit, extending portion is adjacent to pedestal metal; and in second direction along a longer side of each pixel unit, length of extending portion is smaller than length of pedestal metal.

8 Claims, 21 Drawing Sheets

Related U.S. Application Data continuation of application No. 16/810,322, filed on Mar. 5, 2020, now Pat. No. 10,948,793, which is a continuation of application No. 16/122,408, filed on Sep. 5, 2018, now Pat. No. 10,591,793, which is a continuation of application No. 15/144,178, filed on May 2, 2016, now Pat. No. 10,095,078, which is a continuation of application No. 14/157,053, filed on Jan. 16, 2014, now Pat. No. 9,348,190.

(51) Int. Cl.
  *G02F 1/1335* (2006.01)
  *G02F 1/1343* (2006.01)
  *H01L 29/786* (2006.01)
  *G02F 1/136* (2006.01)

(52) U.S. Cl.
  CPC .... *G02F 1/134336* (2013.01); *G02F 1/13606* (2021.01); *G02F 2201/40* (2013.01); *H01L 29/78645* (2013.01); *H01L 29/78696* (2013.01)

(58) Field of Classification Search
  CPC ........... G02F 2201/40; H01L 29/78645; H01L 29/78696
  See application file for complete search history.

(56) References Cited

U.S. PATENT DOCUMENTS

| | | | |
|---|---|---|---|
| 2002/0014624 A1* | 2/2002 | Yamazaki | H01L 27/1255 |
| | | | 257/E27.113 |
| 2005/0219436 A1 | 10/2005 | Kwon | |
| 2010/0330718 A1 | 12/2010 | Lee et al. | |
| 2011/0073867 A1 | 3/2011 | Xie et al. | |
| 2011/0215327 A1 | 9/2011 | Ohtani | |
| 2012/0120362 A1 | 5/2012 | Choi et al. | |
| 2012/0229745 A1 | 9/2012 | Harada | |
| 2012/0268396 A1 | 10/2012 | Kim et al. | |

FOREIGN PATENT DOCUMENTS

| | | |
|---|---|---|
| JP | 2009-300477 | 12/2009 |
| WO | 2012/144517 | 10/2012 |

\* cited by examiner

LIQUID CRYSTAL DISPLAY

CROSS REFERENCES TO RELATED APPLICATIONS

The present application is a continuation application of U.S. patent application Ser. No. 17/201,554, filed on Mar. 15, 2021, which is a continuation application of U.S. patent application Ser. No. 16/810,322, filed on Mar. 5, 2020, issued as U.S. Pat. No. 10,948,793 on Mar. 16, 2021, which is a continuation application of U.S. patent application Ser. No. 16/122,408, filed on Sep. 5, 2018, issued as U.S. Pat. No. 10,591,793 on Mar. 17, 2020, which is a continuation application of U.S. patent application Ser. No. 15/144,178, filed on May 2, 2016, issued as U.S. Pat. No. 10,095,078 on Oct. 9, 2018, which is a continuation application of U.S. patent application Ser. No. 14/157,053, filed on Jan. 16, 2014, issued as U.S. Pat. No. 9,348,190 on May 24, 2016, which claims priority to Japanese Priority Patent Application JP 2013-008822 filed in the Japan Patent Office on Jan. 21, 2013, the entire content of which is hereby incorporated by reference.

BACKGROUND

1. Technical Field

The present disclosure relates to a liquid crystal display panel including liquid crystals.

2. Description of the Related Art

Recent years have seen increasing demands for display devices for mobile devices, such as mobile phones and electronic paper devices. Such display devices include a display area in which pixels are arranged in a matrix, a vertical drive circuit that selects the pixels in the display area row by row, and a horizontal drive circuit that supplies image signals to the pixels in the row selected by the vertical drive circuit.

Wiring coupled with the vertical drive circuit and the horizontal drive circuit is arranged in the display area of the display device. The display device generates parasitic capacitance acting between these sets of wiring and the pixels. An increase in definition of the display area results in a reduction in an area of the pixels, leading to an increase in the parasitic capacitance acting between the wiring and the pixels.

A technology described in Japanese Patent Application Laid-open Publication No. 2005-284255 (JP-A-2005-284255) discloses a display device as follows. In a structure of a liquid crystal display element that uses an inorganic insulating film as a protection film, light-shielding metal that can shield light and can minimize parasitic capacitance occurring between data wiring and a pixel electrode is additionally disposed between the data wiring and the pixel electrode, and a line width of a black matrix layer is reduced to improve an aperture ratio. Thus, image quality can be improved by improving the aperture ratio and minimizing the parasitic capacitance between the data wiring and the pixel electrode.

Recent years have also seen requirements for higher definition of the display device. Increasing the definition of the display device results in an increase in the pixels, causing an increase in the wiring lines, leading to an increase in space for arranging the wiring. This increases the occupation ratio of the wiring on the display panel, and thereby reduces the percentage of opening serving as an area for transmitting light, that is, the aperture ratio. In the display device, the reduction in the aperture ratio reduces the amount of light transmittable through the display panel relative to the amount of light emitted from a light source.

The display device disclosed in JP-A-2005-284255 improves the aperture ratio by reducing the line width of the black matrix layer. However, a limitation in the aperture ratio imposed by the light-shielding metal limits simultaneous achievement of suppression of the parasitic capacitance acting between the wiring and the pixels and maintenance of the aperture ratio.

For the foregoing reasons, there is a need for a liquid crystal display panel and an electronic apparatus that suppress parasitic capacitance acting between wiring and pixels, and suppress a reduction in aperture ratio.

SUMMARY

According to an aspect, a liquid crystal display panel includes: a first substrate; a second substrate disposed so as to face the first substrate; and a liquid crystal layer interposed between the first and the second substrates. The first substrate includes: a plurality of pixel electrodes arranged in a matrix; thin-film transistors, coupled to the pixel electrodes at a first coupling portion; a plurality of first metal wiring lines, each of which lies in a layer different from a semiconductor layer of the thin-film transistor in a direction orthogonal to a surface of the first substrate, and three-dimensionally crosses some parts of the semiconductor layer, and serves as a scan line; a plurality of second metal wiring lines, each of which extends in a second direction different from a first direction of extension of the first metal wiring lines so as to three-dimensionally cross the first metal wiring lines, and is coupled to a second coupling portion of the thin-film transistor, and serves as a signal line; third metal wiring that is disposed in a plane including the second metal wiring lines and being parallel to the surface of the first substrate, and is coupled to the first coupling portion between the adjacent second metal wiring lines; an insulation layer that insulates the first metal wiring lines, the second metal wiring lines, and the third metal wiring from each other; and extending portions, each of which is an extension in the second direction of a part of metal of the first metal wiring lines. Each of the extending portions extends to a length not exceeding an end on the far side of the third metal wiring from the first metal wiring lines, and a part of the extending portions is disposed in a position overlapping a space between the third metal wiring and the second metal wiring lines in the direction orthogonal to the surface of the first substrate.

According to another aspect, a liquid crystal display panel includes a first substrate, a second substrate disposed so as to face the first substrate, and a liquid crystal layer interposed between the first and the second substrates. The first substrate includes: a plurality of pixel electrodes arranged in a matrix; a transparent common electrode provided nearer to a surface of the first substrate than to the pixel electrodes; thin-film transistors, coupled to the pixel electrodes at a first coupling portion; a plurality of first metal wiring lines, each of which lies in a layer different from a semiconductor layer of the thin-film transistor in a direction orthogonal to the surface of the first substrate, and three-dimensionally crosses some parts of the semiconductor layer, and serves as a scan line; a plurality of second metal wiring lines, each of which extends in a second direction different from a first direction of extension of the first metal wiring lines so as to three-dimensionally cross the first metal wiring lines, and is coupled to a second coupling portion, and serves as a signal line; third metal wiring that is disposed in a plane including the second metal wiring lines and being parallel to the surface of the first substrate, and is coupled to the first coupling portion between the adjacent second metal wiring lines; and an insulation layer that insulates the common electrode, the first metal wiring lines, the second metal wiring lines, and the third metal wiring from each other. A thickness between the common electrode and the surface of the first substrate is smaller in an area overlapping the third metal wiring in the direction orthogonal to the surface of the first substrate than in an area not occupied by the third metal wiring between the adjacent second metal wiring lines.

According to another aspect, a liquid crystal display panel includes a first substrate, a second substrate disposed so as to face the first substrate, and a liquid crystal layer interposed between the first and the second substrates. The first substrate includes: a plurality of pixel electrodes arranged in a matrix; thin-film transistors, coupled to the pixel electrodes at a first coupling portion; a plurality of first metal wiring lines, each of which lies in a layer different from a semiconductor layer of the thin-film transistor in a direction orthogonal to a surface of the first substrate, and three-dimensionally crosses some parts of the semiconductor layer, and serves as a scan line; plurality of second metal wiring lines, each of which extends in a second direction different from a first direction of extension of the first metal wiring lines so as to three-dimensionally cross the first metal wiring lines, and is coupled to a second coupling portion of the thin-film transistor, and serves as a signal line; third metal wiring that is disposed in a plane including the second metal wiring lines and being parallel to the surface of the first substrate, and is coupled to the first coupling portion between the adjacent second metal wiring lines; an insulation layer that insulates the first metal wiring lines, the second metal wiring lines, and the third metal wiring from each other; and bypass portions of the first metal wiring lines, each of the bypass portions bypassing, through a position deviated in the second direction, the first coupling portion lying on a line extended in the first direction of extension of the first metal wiring line from the intersection where the first metal wiring line and the second metal wiring line three-dimensionally cross each other in a separate manner in the direction orthogonal to the first substrate.

Additional features and advantages are described herein, and will be apparent from the following Detailed Description and the figures.

DETAILED DESCRIPTION

Embodiments for practicing the present disclosure will be described in detail with reference to the accompanying drawings. The description of the embodiments below will not limit the present disclosure. The constituent elements described below include elements easily conceived by those skilled in the art and substantially identical elements. The constituent elements described below can also be combined as appropriate. The description will be made in the following order.

Figure 1:
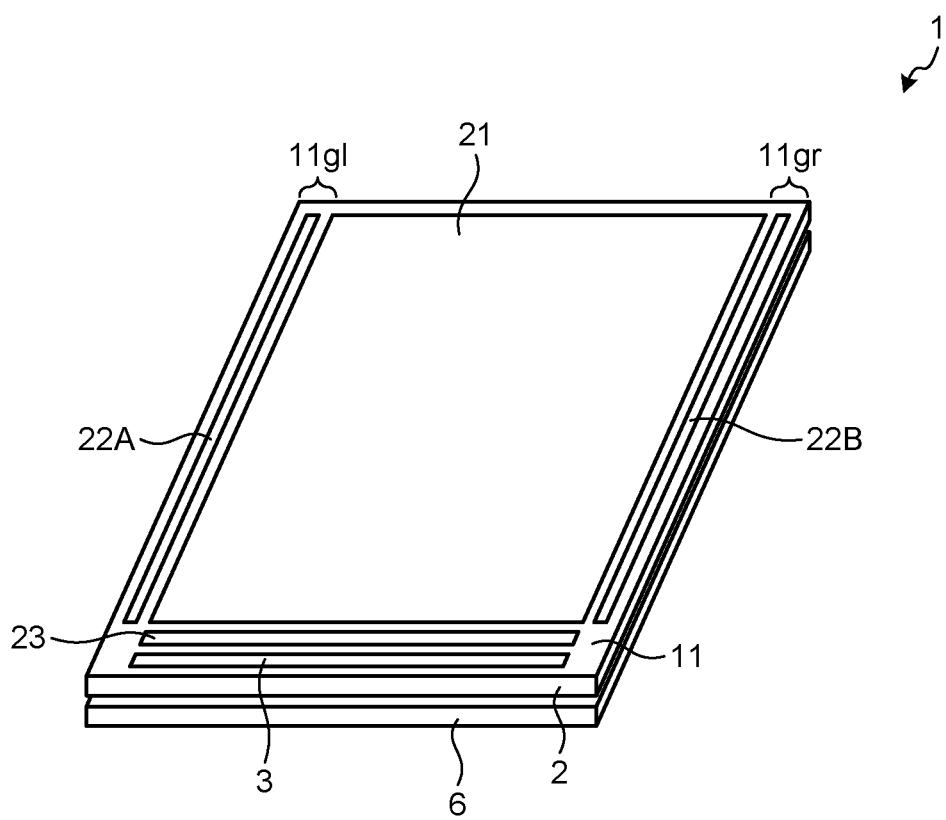
FIG. 1 is an explanatory diagram illustrating an example of a configuration of a liquid crystal display panel according to each of first and second embodiments of the present disclosure and modifications thereof.
Figure 2:
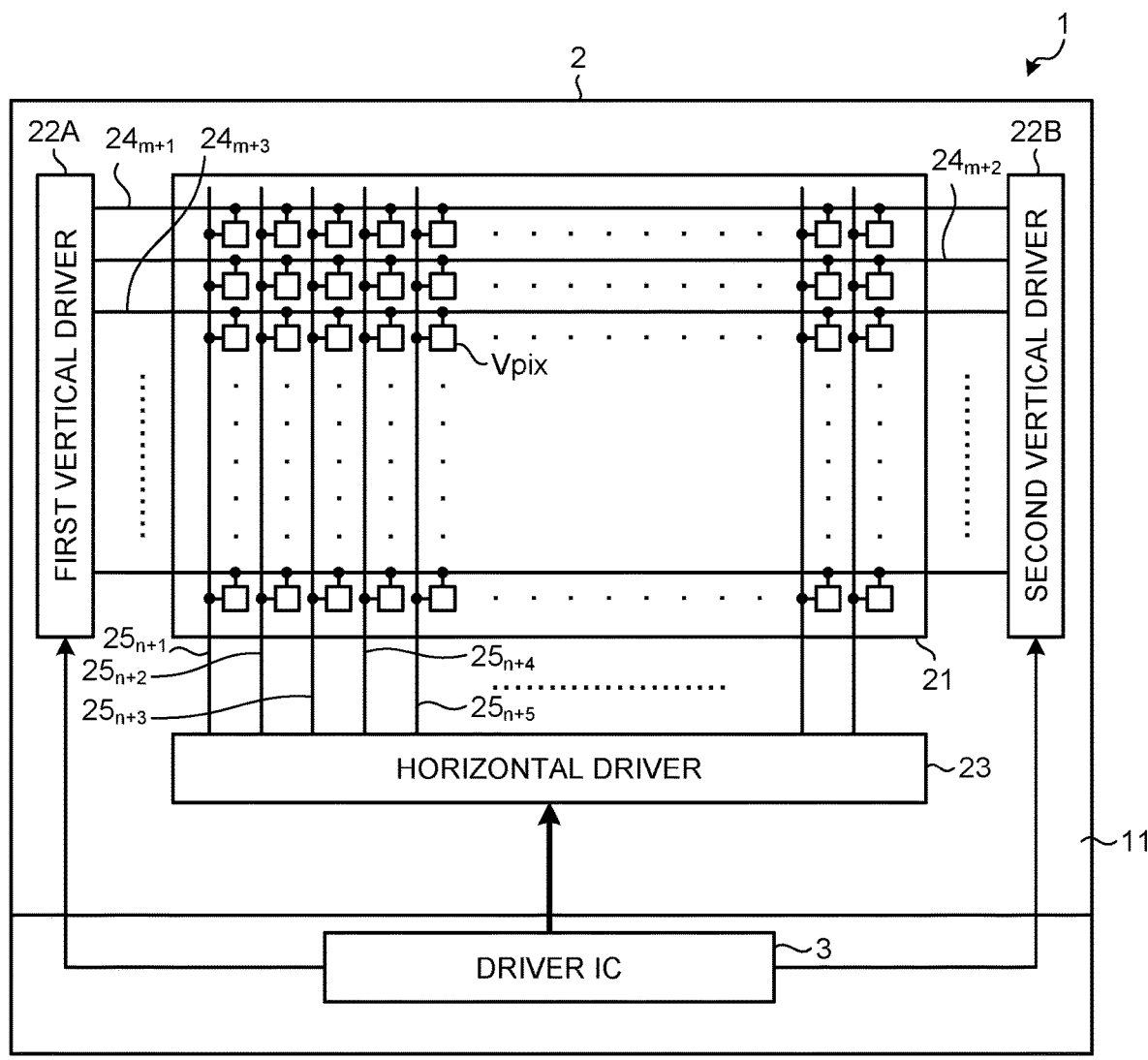
FIG. 2 is a block diagram illustrating a system configuration example of the liquid crystal display panel of FIG. 1.

1. Embodiments (Liquid Crystal Display Panel)
1-1. First Embodiment
1-2. Second Embodiment
2. Application Examples (Electronic Apparatuses)
Examples in which a liquid crystal display panel according to either of the embodiments mentioned above is applied to electronic apparatuses
3. Aspects of Present Disclosure
1. Embodiments (Liquid Crystal Display Panel)
1-1. First Embodiment
1-1A. Configuration FIG. 1 is an explanatory diagram illustrating an example of a configuration of a liquid crystal display panel according to each of first and second embodiments of the present disclosure and modifications thereof. FIG. 2 is a block diagram illustrating a system configuration example of the liquid crystal display panel of FIG. 1. FIG. 1 is a schematic illustration, in which dimensions and shapes are not necessarily the same as actual dimensions and shapes. A display device 1 corresponds to a specific example of the "liquid crystal display panel" of the present disclosure.

The display device 1 is a transmissive or transflective display device, and includes a liquid crystal display panel 2, a driver IC 3, and a backlight 6. The display device 1 may be a reflective display device that does not include the backlight 6. A flexible printed circuit (FPC) (not illustrated) transmits external signals to the driver IC 3 and/or drive power to drive the driver IC 3. The liquid crystal display panel 2 includes transparent insulating substrates, such as a glass substrate 11; a display area 21 that is formed on a surface of the glass substrate 11 and includes a plurality of pixels arranged in a matrix, the pixels including liquid crystal cells; a horizontal driver (horizontal drive circuit) 23; and vertical drivers (vertical drive circuit) 22A and 22B. The vertical drivers (vertical drive circuit) 22A and 22B are arranged as the first vertical driver 22A and the second vertical driver 22B so as to interpose the display area 21 therebetween. The glass substrate 11 includes a first substrate on which a plurality of pixel circuits including active elements (such as transistors) are arranged and formed in a matrix, and a second substrate that is arranged so as to face the first substrate with a predetermined gap therebetween. The glass substrate 11 also includes a liquid crystal layer filled with liquid crystals between the first and the second substrates.

Frame portions 11$gr$ and 11$gl$ of the liquid crystal display panel 2 are arranged on a surface of the glass substrate 11, and are non-display areas that are not occupied by the display area 21 including the pixels arranged in a matrix, the pixels including the liquid crystal cells. The vertical drivers 22A and 22B are disposed on the frame portions 11$gr$ and 11$gl$.

The backlight 6 is disposed on the back surface (surface on the opposite side of the surface to display an image) of the liquid crystal display panel 2. The backlight 6 emits light toward the liquid crystal display panel 2 and irradiates the whole surface of the display area 21 with the light. The backlight 6 includes, for example, a light source and a light guide plate that guides the light output from the light source and emits the light toward the back surface of the liquid crystal display panel 2.

System Configuration Example of Display Device

The liquid crystal display panel 2 includes, on the glass substrate 11, the display area 21, the driver IC 3 that has functions of an interface (I/F) and a timing generator, the first vertical driver 22A, the second vertical driver 22B, and the horizontal driver 23.

In the display area 21, pixels Vpix including liquid crystal layers have a matrix structure in which units each constituting one pixel in terms of display are arranged in a matrix of M rows×N columns. In the present specification, the row refers to a pixel row including N pixels Vpix arranged in one direction. The column refers to a pixel column including N pixels Vpix arranged in a direction orthogonal to the direction of the arrangement in the row. The values of M and N are determined according to a vertical display resolution and a horizontal display resolution. For the array of the pixels Vpix of M rows and N columns in the display area 21, scan lines $24_1, 24_2, 24_3, \ldots, 24_M$ are wired for the respective rows, and signal lines $25_1, 25_2, 25_3, \ldots, 25_N$ are wired for the respective columns. Hereinafter, the present embodiment may represent the scan lines $24_1, 24_2, 24_3, \ldots, 24_M$ as scan lines 24, and may represent the signal lines $25_1, 25_2, 25_3, \ldots, 25_N$ as signal lines 25. The present embodiment may also represent the scan lines $24_1, 24_2, 24_3, \ldots, 24_M$ as scan lines $24_{m+1}, 24_{m+2}, 24_{m+3}$, and the signal lines $25_1, 25_2$, $25_3, \ldots, 25_N$ as signal lines $25_{n+1}, 25_{n+2}, 25_{n+3}$. The display area 21 is arranged in an area in which the scan lines 24 and the signal lines 25 overlap a black matrix of a color filter when viewed from a direction orthogonal to a front surface. In the display area 21, areas in which the black matrix is not arranged are open portions.

The liquid crystal display panel 2 is externally supplied with external signals, that is, a master clock, a horizontal synchronizing signal, and a vertical synchronizing signal, which are in turn supplied to the driver IC 3. The driver IC 3 converts the levels (increases the voltages) of the master clock, the horizontal synchronizing signal, and the vertical synchronizing signal having voltage amplitudes of an external power supply to voltage amplitudes of an internal power supply required to drive the liquid crystals, thus generating increased amplitude signals of the master clock, the horizontal synchronizing signal, and the vertical synchronizing signal. The driver IC 3 supplies the master clock, the horizontal synchronizing signal, and the vertical synchronizing signal thus generated to the first vertical driver 22A, the second vertical driver 22B, and the horizontal driver 23. The driver IC 3 generates, for pixel electrodes of the respective pixels Vpix, a common potential (counter electrode potential) Vcom to be given commonly to the pixels, and supplies the common potential Vcom to the display area 21.

The first vertical driver 22A and the second vertical driver 22B each include a shift register (to be described later) and a latch circuit, for example. In each of the first vertical driver 22A and the second vertical driver 22B, the latch circuit sequentially samples and latches display data output from the driver IC 3 in one horizontal period in a manner synchronized with vertical clock pulses. Each of the first vertical driver 22A and the second vertical driver 22B sequentially outputs digital data of one line latched in the latch circuit as a vertical scan pulse, and supplies the digital data to each of the scan lines $24_{m+1}, 24_{m+2}, 24_{m+3}, \ldots$ of the display area 21 so as to sequentially select the pixels Vpix row by row. The first vertical driver 22A and the second vertical driver 22B are arranged so as to interpose therebetween the scan lines $24_{m+1}, 24_{m+2}, 24_{m+3}, \ldots$ in the extending direction of the scan lines $24_{m+1}, 24_{m+2}, 24_{m+3}, \ldots$. The first vertical driver 22A and the second vertical driver 22B sequentially output the digital data to the scan lines $24_{m+1}, 24_{m+2}, 24_{m+3}, \ldots$, for example, starting from an upper side in the upper direction of vertical scanning of the display area 21 down to a lower side in the lower direction of vertical scanning of the display area 21. The first vertical driver 22A and the second vertical driver 22B can also sequentially output the digital data to the scan lines $24_{m+1}, 24_{m+2}, 24_{m+3}, \ldots$ starting from a lower side in the lower direction of vertical scanning of the display area 21 up to an upper side in the upper direction of vertical scanning of the display area 21.

The horizontal driver 23 is supplied with, for example, 6-bit digital video data Vsig of red (R), green (G), and blue (B). The horizontal driver 23 writes the display data via the signal lines 25 to the pixels Vpix of a row selected through the vertical scan by the first vertical driver 22A and the second vertical driver 22B, pixel by pixel, or a plurality of pixels at a time, or all pixels at a time.

Driving Method of Liquid Crystal Display Panel

Figure 3:
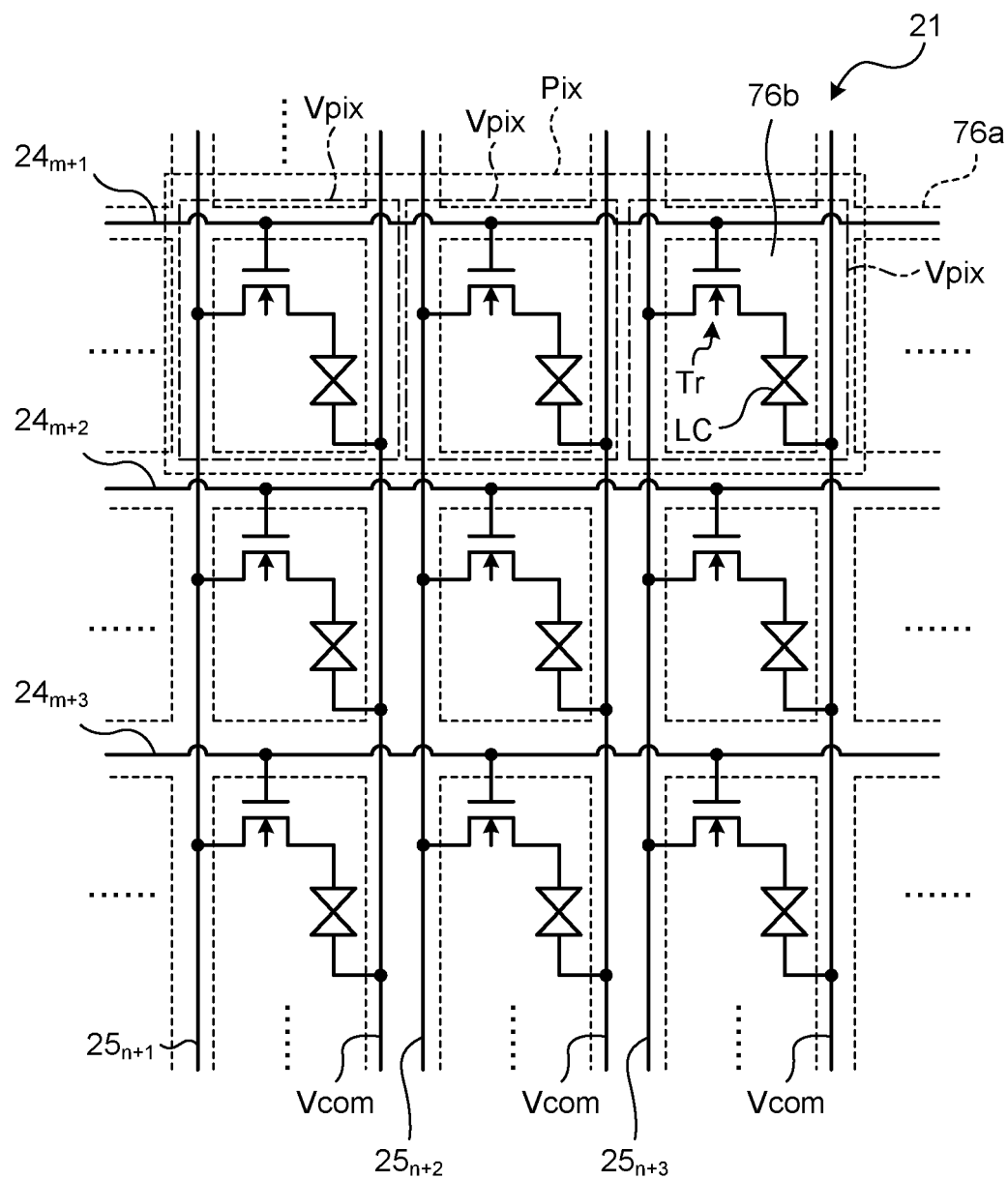
FIG. 3 is a circuit diagram illustrating an example of a drive circuit that drives pixels.

The display area 21 is formed with the wiring, such as the signal lines $25_{n+1}, 25_{n+2}, 25_{n+3}$ that supply pixel signals as the display data to thin-film transistors (TFTs) Tr of the pixels Vpix, and the scan lines $24_{m+1}, 24_{m+2}, 24_{m+3}$ that drive the thin-film transistors Tr, as illustrated in FIG. 3. In this manner, the signal lines $25_{n+1}, 25_{n+2}, 25_{n+3}$ extend in a plane parallel to the surface of the glass substrate 11 described above, and supply the pixel signals for displaying an image to the pixels Vpix. The pixel Vpix includes the thin-film transistor Tr and a liquid crystal element LC. In the present example, the thin-film transistor Tr is composed of an n-channel metal oxide semiconductor (MOS) type TFT. One of a source and a drain of the thin-film transistor Tr is coupled to one of the signal lines $25_{n+1}, 25_{n+2}, 25_{n+3}$; a gate thereof is coupled to one of the scan lines $24_{m+1}, 24_{m+2}, 24_{m+3}$; and the other of the source and the drain thereof is coupled to one end of the liquid crystal element LC. One end of the liquid crystal element LC is coupled to the thin-film transistor Tr, and the other end thereof is coupled to a common electrode COML to which the common potential Vcom is supplied.

Each pixel Vpix is coupled with the other pixels Vpix belonging to the same row of the display area 21 via one of the scan lines $24_{m+1}, 24_{m+2}, 24_{m+3}$. The odd-numbered scan lines $24_{m+1}, 24_{m+3}$ of the scan lines $24_{m+1}, 24_{m+2}, 24_{m+3}, 24_{m+4}$ are coupled with the first vertical driver 22A, and are supplied from the first vertical driver 22A with a vertical scan pulse Vgate of a scan signal, to be described later. The even-numbered scan lines $24_{m+2}, 24_{m+4}$ of the scan lines $24_{m+1}, 24_{m+2}, 24_{m+3}, 24_{m+4}$ are coupled with the second vertical driver 22B, and supplied from the second vertical driver 22B with the vertical scan pulse Vgate of the scan signal, to be described later. In this manner, the first vertical driver 22A and the second vertical driver 22B alternately apply the vertical scan pulses Vgate to the scan lines $24_{m+1}, 24_{m+2}, 24_{m+3}$ in the scan direction. Each pixel Vpix is coupled with the other pixels Vpix belonging to the same column of the display area 21 via one of the signal lines $25_{n+1}, 25_{n+2}, 25_{n+3}$. The signal lines $25_{n+1}, 25_{n+2}, 25_{n+3}$ are coupled with the horizontal driver 23, and supplied with the pixel signals from the horizontal driver 23. Each pixel Vpix is also coupled to the other pixels Vpix belonging to the same column of the display area 21 via the common electrode COML. The common electrode COML is coupled with a drive electrode driver (not illustrated), and supplied with the common potential Vcom from the drive electrode driver.

Each of the first vertical driver 22A and the second vertical driver 22B illustrated in FIGS. 1 and 2 applies the vertical scan pulse Vgate to the gates of the thin-film transistors Tr of the pixels Vpix via each of the scan lines $24_{m+1}, 24_{m+2}, 24_{m+3}$ illustrated in FIG. 3 so as to sequentially select one row (one horizontal line) of the pixels Vpix formed in a matrix in the display area 21 as a row to be driven for display. The horizontal driver 23 illustrated in FIGS. 1 and 2 supplies the pixel signals, via the signal lines $25_{n+1}, 25_{n+2}, 25_{n+3}$ illustrated in FIG. 3, to the respective pixels Vpix included in one horizontal line sequentially selected by the first vertical driver 22A and the second vertical driver 22B. Then, these pixels Vpix of one horizontal line perform display according to the supplied pixel signals.

As described above, in the display device 1, the first vertical driver 22A and the second vertical driver 22B drive the scan lines $24_{m+1}, 24_{m+2}, 24_{m+3}$ to sequentially perform scanning, and thereby sequentially select one horizontal line. In the display device 1, the horizontal driver 23 supplies the pixel signals to the pixels Vpix belonging to one horizontal line, and thereby, the display is performed one horizontal line at a time. When this display operation is performed, the drive electrode driver applies the common potential Vcom to the common electrode COML corresponding to the horizontal line.

In the display device 1, a continuous application of direct current of the same polarity to the liquid crystal element LC can cause deterioration of the liquid crystal in a specific resistance (resistance value specific to a substance) of the liquid crystal or the like. To prevent the deterioration of the liquid crystal in the specific resistance (resistance value specific to a substance) or the like, the display device 1 employs a driving method in which the polarity of a video signal is inverted with respect to the common potential Vcom of the drive signals at a predetermined period.

For example, column inversion, line inversion, dot inversion, and frame inversion driving methods are known as driving methods for the liquid crystal display panel. The column inversion driving method is a driving method in which the polarity of the video signal is inverted at a predetermined period (for example, at a frame period) in such a manner that the polarities of the video signals supplied to the adjacent signal lines 25 are different from each other. The line inversion driving method is a driving method in which the polarity of the video signal is inverted at a period of time of 1 H (H is a horizontal period) corresponding to one line (one pixel row). The dot inversion driving method is a driving method in which the polarity of the video signal is alternately inverted between pixels adjacent in up-down and left-right directions. The frame inversion driving method is a driving method in which the video signals written to all pixels in one frame corresponding to one screen are inverted at once into the same polarity. The display device 1 can employ any of the above-described driving methods.

Figure 4:
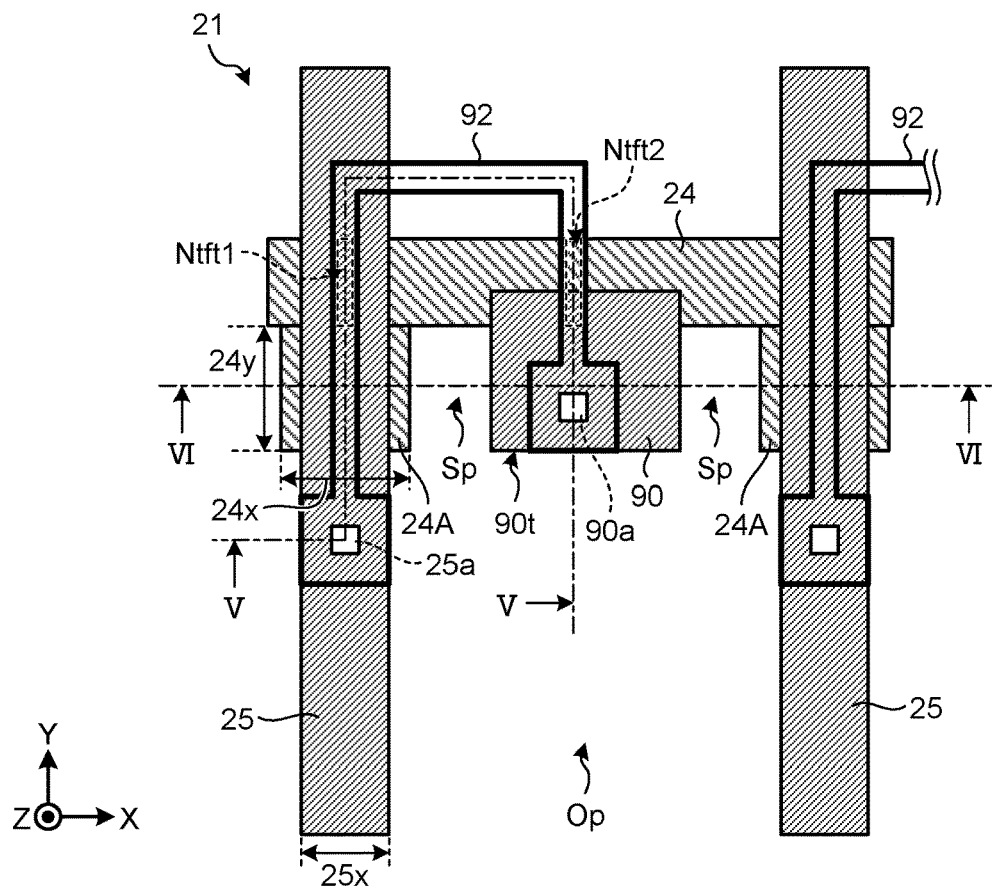
FIG. 4 is a schematic diagram for explaining a circuit pattern of the liquid crystal display panel according to the first embodiment.
Figure 5:
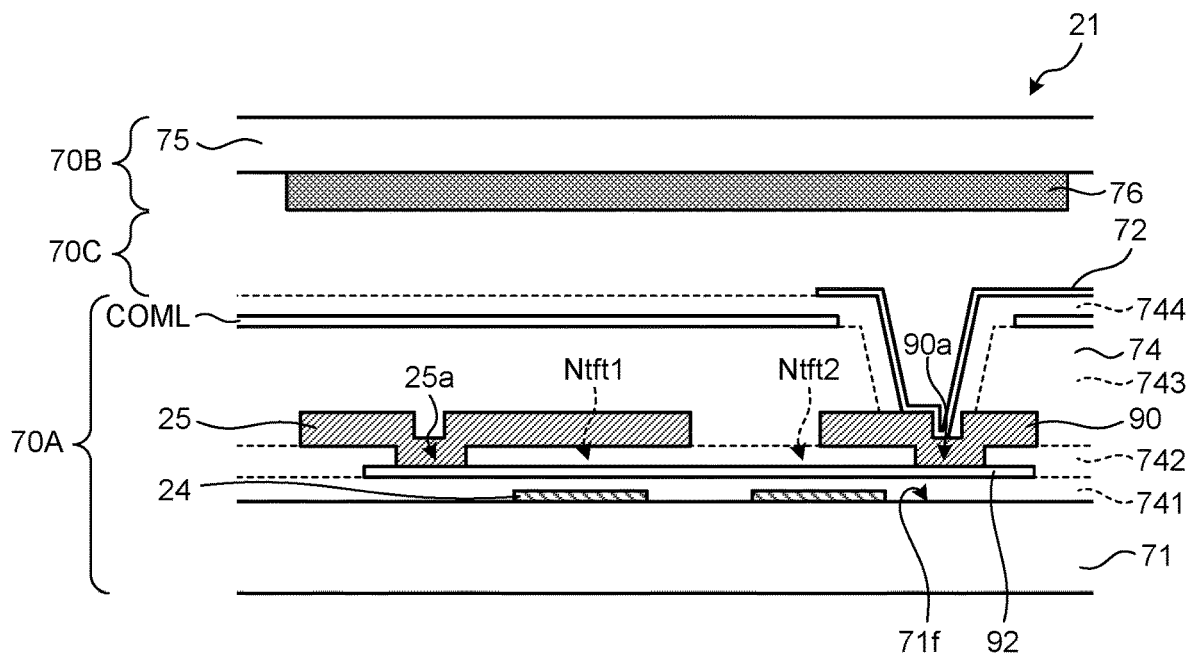
FIG. 5 is a V-V line sectional view of FIG. 4.
Figure 6:
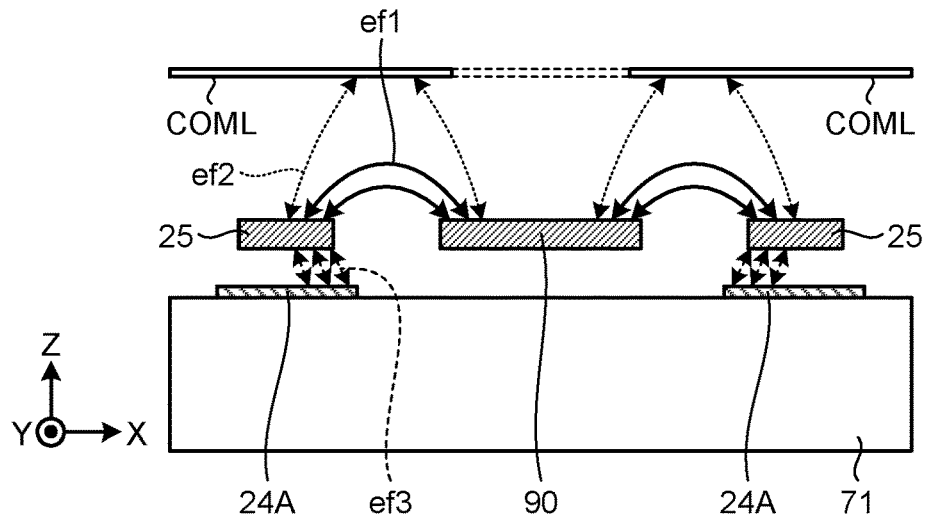
FIG. 6 is a schematic diagram of lines of electric force in VI-VI line sectional view of FIG. 4.

A configuration of the display area 21 will be described in detail. FIG. 4 is a schematic diagram for explaining a circuit pattern of the liquid crystal display panel according to the first embodiment. FIG. 5 is a V-V line sectional view of FIG. 4. FIG. 6 is a schematic diagram of lines of electric force in VI-VI line sectional view of FIG. 4. As illustrated in FIG. 5, the display area 21 includes a pixel substrate 70A, a counter substrate 70B disposed so as to face a surface of the pixel substrate 70A in a direction orthogonal thereto, and a liquid crystal layer 70C interposed between the pixel substrate 70A and the counter substrate 70B. The backlight 6 is disposed on a surface of the pixel substrate 70A opposite to the liquid crystal layer 70C.

The liquid crystal layer 70C used in the liquid crystal display device modulates light passing through an electric field according to the state of the electric field, and uses liquid crystals of a horizontal electric field mode, such as a fringe field switching (FFS) mode or an in-plane switching (IPS) mode. The liquid crystal layer 70C may be formed of liquid crystals of any of various modes, such as a twisted nematic (TN) mode, a vertical alignment (VA) mode, and an electrically controlled birefringence (ECB) mode. An orientation film may be interposed between the liquid crystal layer 70C and the pixel substrate 70A, and between the liquid crystal layer 70C and the counter substrate 70B, which are illustrated in FIG. 5.

The counter substrate 70B includes a glass substrate 75 and a color filter 76 formed on one surface of the glass substrate 75. The color filter 76 includes color regions colored, for example, in three colors of red (R), green (G), and blue (B). The color regions colored, for example, in the three colors of red (R), green (G), and blue (B) are periodically arranged at open portions 76b of the color filter 76, and each of the color regions of the three colors of R, G, and B is associated with each of the pixels Vpix illustrated in FIG. 3 to form a pixel Pix as one set. The color filter 76 faces the liquid crystal layer 70C in a direction orthogonal to a TFT substrate 71. The color filter 76 may have a combination of other colors if colored in different colors. The color filter 76 generally gives the color region of green (G) a higher luminance than those of the color regions of red (R) and blue (B). A black matrix 76a may be formed so as to cover the outer circumferences of the pixels Vpix illustrated in FIG. 3. The black matrix 76a is disposed at boundaries between the two-dimensionally arranged pixels Vpix so as to have a grid shape. The black matrix is formed of a material having high absorption of light.

The pixel substrate 70A includes the TFT substrate 71 as a circuit substrate, a plurality of pixel electrodes 72 arranged in a matrix above the TFT substrate 71, the common electrode COML formed between the TFT substrate 71 and the pixel electrodes 72, and an insulation layer 74 insulating the pixel electrodes 72 from the common electrode COML. The common electrode COML is a transparent electrode formed of a transparent conductive material (transparent conductive oxide), such as indium tin oxide (ITO).

The TFT substrate 71 is laminated with a semiconductor layer 92 on which the above-described thin-film transistors Tr of the pixels Vpix are formed, and wiring such as the signal lines 25 that supply the pixel signals to the pixel electrodes 72 and the scan lines 24 that drive the thin-film transistors Tr, with the insulation layer 74 interposed therebetween. The insulation layer 74 is formed of layers of, for example, an insulating layer 741 between the scan lines 24 and the semiconductor layer 92, an insulating layer 742 between the semiconductor layer 92 and second metal wiring 25, an insulating layer 743 between the second metal wiring 25 and the common electrode COML, and an insulating layer 744 between the common electrode COML and the pixel electrodes 72. The insulating layers 741, 742, 743, and 744 may be formed of the same insulating material, or any of the insulating layers may be formed of a different insulating material from the others. For example, the insulating layer 743 is formed of an organic insulating material such as an acrylic resin, and the other insulating layers (insulating layers 741, 742, and 744) are formed of an inorganic insulating material such as SiN or $SiO_2$.

The signal lines 25 extend in a plane parallel to a surface 71f of the TFT substrate 71, and supply the pixel signals for displaying an image on the pixels. The semiconductor layer 92 is formed of, for example, low-temperature polysilicon. The semiconductor layer 92 is, at a part thereof, coupled to the signal line 25, and at another part thereof, coupled to pedestal wiring 90 formed in the same layer as that of the signal line 25. In the present disclosure, the scan lines 24 are first metal wiring that is wiring of metal such as molybdenum (Mo) or aluminum (Al); the signal lines 25 are the second metal wiring that is wiring of metal such as aluminum; and the pedestal wiring 90 is third metal wiring that is wiring of metal such as aluminum. The insulation layer 74 insulates the scan lines 24, the second metal wiring, and the semiconductor layer 92 from each other except at first coupling portions 90a and second coupling portions 25a (contact holes) that are coupling portions of the wiring.

The semiconductor layer 92, the signal lines 25, and the scan lines 24 are formed in layers different from each other in the direction orthogonal to the surface 71f of the TFT substrate 71 (in the Z-direction). The signal lines 25 and the pedestal wiring 90 are formed in the same layer in the direction orthogonal to the surface 71f of the TFT substrate 71 (in the Z-direction). The scan line 24 three-dimensionally crosses some parts of the semiconductor layer 92, and acts as a gate of the thin-film transistor Tr. In the present disclosure, the scan line 24 three-dimensionally crosses two parts of the semiconductor layer 92, and the thin-film transistor Tr is a double-gate transistor including a first channel Ntft1 serving as an n-channel and a second channel Ntft2 serving as an n-channel. In the semiconductor layer 92, two thin lines extending parallel to each other in the Y-direction are bent at ends thereof as the semiconductor layer bends, thus being integrally formed. The first and the second channels Ntft1 and Ntft2 extend parallel to each other in the Y-direction, and are coupled in series with each other. This structure can reduce the distance between the first and the second channels Ntft1 and Ntft2 of the thin-film transistor Tr. This, in turn, allows the display area 21 according to the first embodiment to have a smaller distance between the signal lines 25 and thus a smaller pixel pitch, leading to a higher definition.

The second coupling portion 25a coupled to the signal line 25 serves as, for example, a source electrode of the thin-film transistor Tr in the semiconductor layer 92. The first coupling portion 90a of the semiconductor layer 92 is coupled with the pixel electrode 72 via the pedestal wiring 90. The first coupling portion 90a coupled to the pedestal wiring 90 serves as, for example, a drain electrode of the thin-film transistor Tr in the semiconductor layer 92. If, for example, the second coupling portion 25a serves as a drain electrode of the thin-film transistor Tr in the semiconductor layer 92, the first coupling portion 90a serves as, for example, a source electrode of the thin-film transistor Tr in the semiconductor layer 92. As illustrated in FIG. 3, the scan line 24 is coupled to a gate of the thin-film transistor Tr in the semiconductor layer 92.

As described above, the scan lines 24 and the signal lines 25 are linear metal wiring, and are arranged so as to three-dimensionally cross each other in directions substantially orthogonal to each other. As illustrated in FIG. 4, the pedestal wiring 90 is disposed, in the Z-direction view, at an edge portion of an area enclosed by the scan lines 24 extending along a first direction (X-direction) and the signal lines 25 extending along a second direction (Y-direction).

The display area 21 according to the first embodiment illustrated in FIG. 5 is laminated in the Z-direction with the TFT substrate 71, the scan line 24, the semiconductor layer 92, the signal line 25, the common electrode COML, and the pixel electrode 72 in this order. The display area 21 according to the first embodiment has a bottom gate structure in which the semiconductor layer 92 is disposed in a plane between the scan line 24 and the signal line 25 in the Z-direction. The display area 21 according to the first embodiment may have a top gate structure in which the scan line 24 is disposed in a plane between the semiconductor layer 92 and the signal line 25 in the Z-direction. An extending portion 24A of the scan line 24 is metal wiring provided on the same plane as a plane parallel to the surface 71f of the TFT substrate 71 on which the scan line 24 extends in the X-direction. The extending portion 24A is an extension in the Y-direction of a part of electrically conductive metal of the scan line 24. This causes the extending portion 24A to be electrically coupled with the scan line 24 and thus have the same potential as that of the scan line 24. This allows the extending portion 24A to serve as both an electric field shield and a gate electrode of the thin-film transistor Tr. This, in turn, reduces the overall layout area and improves the aperture ratio. This results in allowing the display area 21 according to the first embodiment to support higher definition pixels.

As illustrated in FIG. 4, a space Sp exists between the pedestal wiring 90 and the signal line 25 in the Z-direction view. The pedestal wiring 90 has the spaces Sp on both sides thereof in the X-direction. An area not occupied by the pedestal wiring 90 between the adjacent signal lines 25 illustrated in FIG. 4 forms an opening area Op. If a length 24y exceeds an end 90t on the far side of the pedestal wiring 90 from the scan line 24, the extending portion 24A overlaps the opening area Op. This causes the extending portion 24A to shield light passing through the opening area Op, so that the extending portion 24A can reduce the aperture ratio. The length 24y of the extending portion 24A according to the first embodiment projecting from the scan line 24 does not exceed the end 90t on the far side of the pedestal wiring 90 from the scan line 24. This keeps the extending portion 24A according to the first embodiment from overlapping the opening area Op in the Z-direction. The extending portion 24A has a width 24x enough to overlap the signal line 25 in the Z-direction and to protrude to the space Sp. In other words, the width 24x in the X-direction of the extending portion 24A is larger than a width 25x in the X-direction of the signal line 25. In this manner, the extending portion 24A partially overlaps the space Sp in the Z-direction. The extending portion 24A according to the first embodiment can suppress the reduction in the aperture ratio by avoiding overlapping the opening area Op in the Z-direction. In this manner, the extending portion 24A partially overlaps the space Sp but does not overlap the opening area Op in the Z-direction.

1-1B. Operation and Effect

As illustrated in FIG. 4, the extending portion 24A partially overlaps the space Sp, thereby reducing the parasitic capacitance between the signal line 25 and the pixel electrode 72. As illustrated in FIG. 6, lines of electric force ef1, ef2, and ef3 act on the pedestal wiring 90 coupled to the pixel electrode 72 and on the signal lines 25. The lines of electric force ef2 are potential lines acting between the pedestal wiring 90 and the signal line 25 via the common electrode COML. The lines of electric force ef1 are potential lines directly acting between the pedestal wiring 90 and the signal line 25. The lines of electric force ef3 are potential lines directly acting between the extending portion 24A and the signal line 25. An operation of the display device 1 according to the first embodiment will be described in comparison with an evaluation example.

Figure 7:
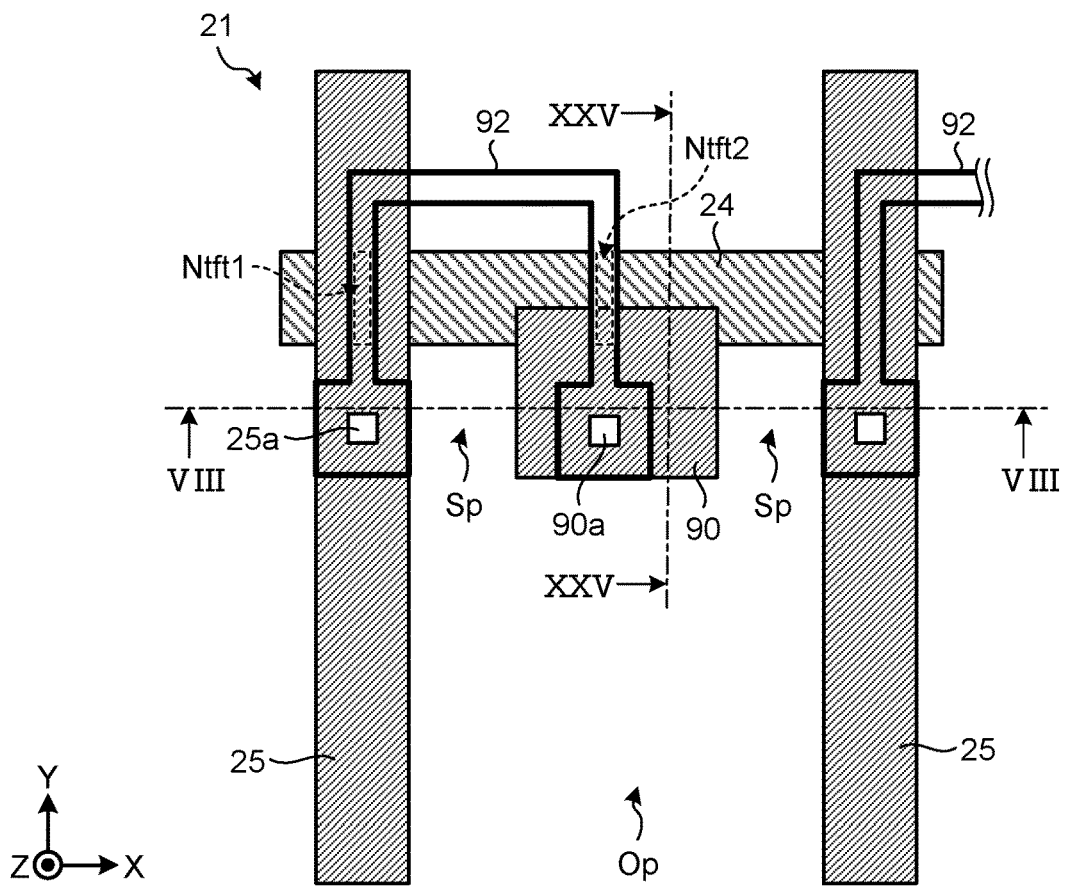
FIG. 7 is a schematic diagram for explaining a circuit pattern of a liquid crystal display panel according to an evaluation example.
Figure 8:
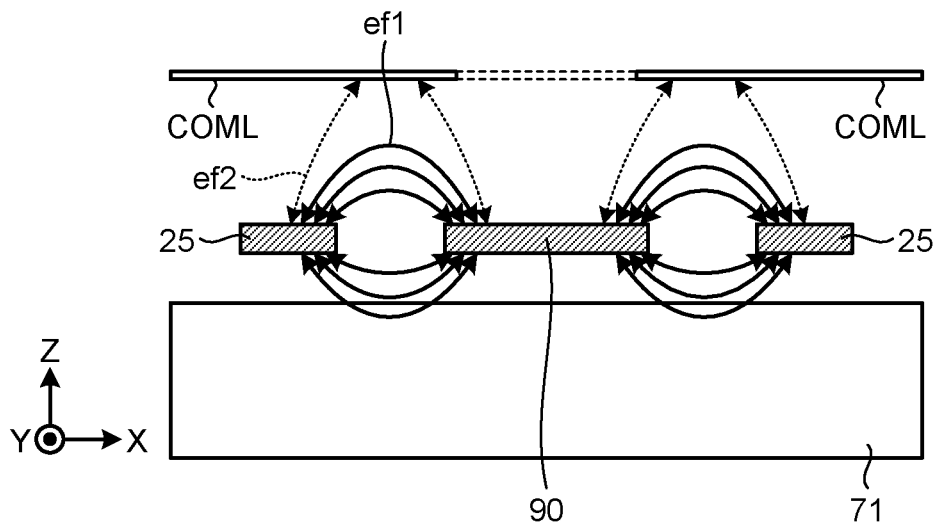
FIG. 8 is a schematic diagram of the lines of electric force in VIII-VIII line sectional view of FIG. 7.

FIG. 7 is a schematic diagram for explaining a circuit pattern of a liquid crystal display panel according to an evaluation example. A description of XXV-XXV line sectional view of FIG. 7 will be made later in the second embodiment. FIG. 8 is a schematic diagram of the lines of electric force in VIII-VIII line sectional view of FIG. 7. A display area 21 of the evaluation example does not include any extending portion 24A such as that of the display area 21 according to the first embodiment. This increases the density of the lines of electric force ef1 acting between the pedestal wiring 90 coupled to the pixel electrode 72 and the signal line 25, as illustrated in FIG. 8. The extending portion 24A according to the first embodiment generates the lines of electric force ef3 so that the density of the lines of electric force ef1 illustrated in FIG. 8 can be reduced similarly to the lines of electric force ef1 illustrated in FIG. 6. This suppresses the magnitude of the electric field between the pedestal wiring 90 and the signal line 25. This results in capability of suppressing the parasitic capacitance between the pixel electrode 72 and the signal line 25.

Figure 9:
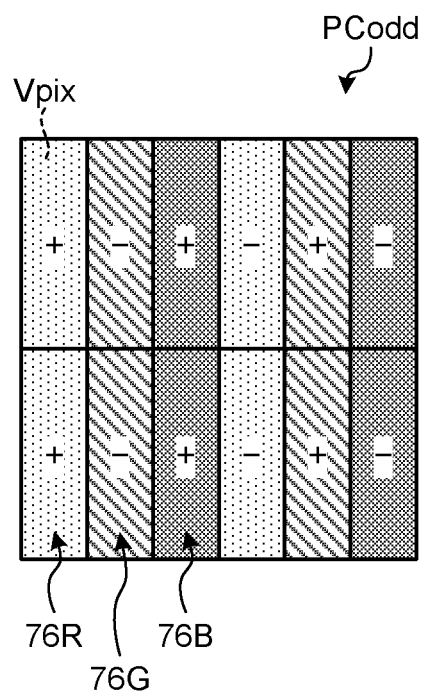
FIG. 9 is a schematic diagram for explaining a display area driven by column inversion.
Figure 10:
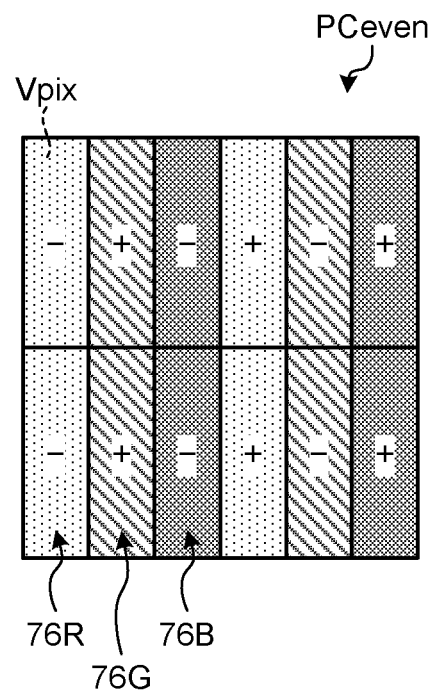
FIG. 10 is a schematic diagram for explaining the display area driven by the column inversion.
Figure 11:
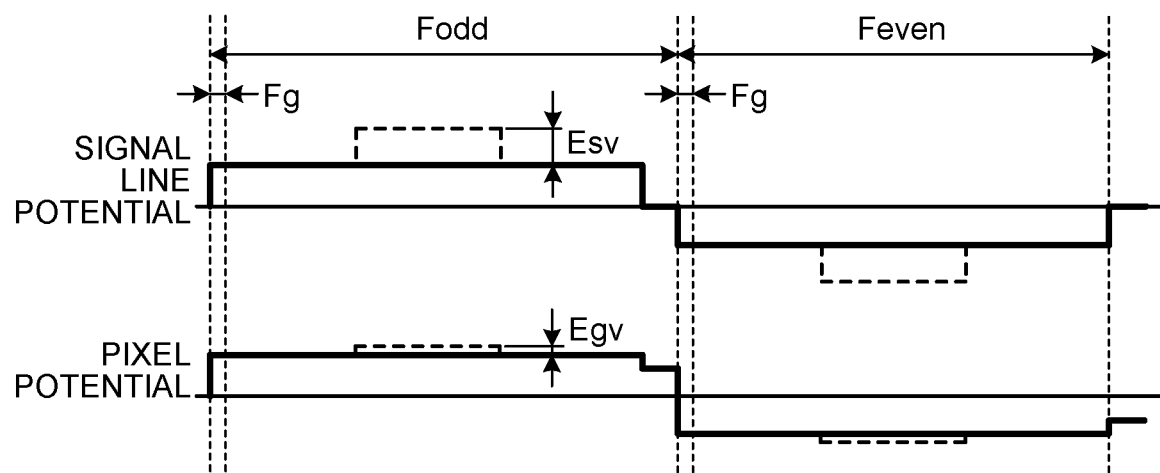
FIG. 11 is a schematic diagram for explaining a relation between a signal line potential and a pixel potential when the column inversion driving is performed.
Figure 12:
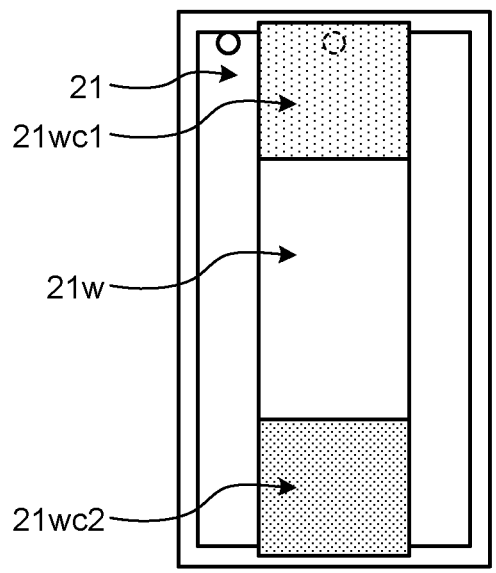
FIG. 12 is a schematic diagram for explaining crosstalk generated in the display area.

FIGS. 9 and 10 are schematic diagrams for explaining the display area driven by the column inversion. FIG. 11 is a schematic diagram for explaining a relation between a signal line potential and a pixel potential when the column inversion driving is performed. FIG. 12 is a schematic diagram for explaining crosstalk generated in the display area. As described above, the column inversion driving method is a driving method in which the polarity of the video signal is inverted at a predetermined period (for example, at a frame period) in such a manner that the polarities of the video signals supplied to the adjacent signal lines 25 are different from each other. For example, in the color filter 76 of the pixels Vpix, a potential of positive (+) polarity or a potential of negative (−) polarity is applied to each of the pixels corresponding to, for example, color regions 76R, 76G, and 76B colored in the three colors of red (R), green (G), and blue (B) arranged in the row direction so as to alternately repeat an application state PCodd illustrated in FIG. 9 and an application state PCeven illustrated in FIG. 10.

As illustrated in FIG. 11, a period Fodd of the application state PCodd illustrated in FIG. 9 and a period Feven of the application state PCeven illustrated in FIG. 10 are alternately repeated with a writing period Fg as a border therebetween. Suppose, as illustrated in FIG. 12, a window image 21w having a high luminance is displayed in the center of the display area 21. As illustrated in FIG. 11, the polarity inversion period of the pixel potential and the polarity inversion period of the signal line potential substantially coincide with the period Fodd and the period Feven. This causes a signal line average potential Esv in one frame period of each of the period Fodd and the period Feven to vary depending on whether or not the window image 21w is displayed. This leads to a result that the parasitic capacitance acting from the signal line 25 via the pedestal wiring 90 causes a change in a pixel potential variation amount Egv for one frame of the pixel potential depending on whether or not the window image 21w is displayed. This, in turn, can generate an image called vertical crosstalk, which does not occur normally, in areas 21wc1 and 21wc2 near the window image 21w illustrated in FIG. 12. A reduction in the parasitic capacitance acting from the signal line 25 via the pedestal wiring 90 suppresses the possibility of appearance of the normally not occurring image called vertical crosstalk.

Figure 13:
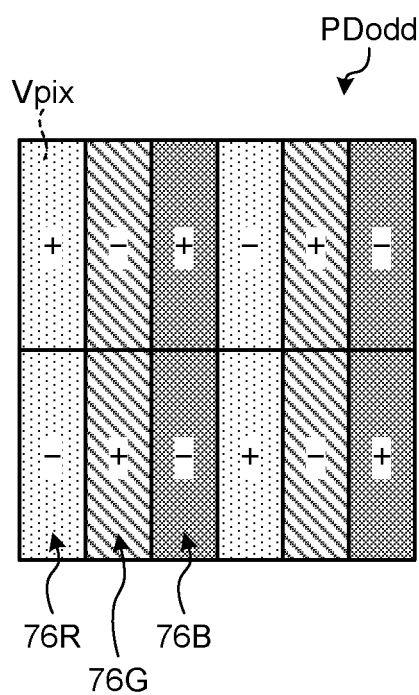
FIG. 13 is a schematic diagram for explaining the display area driven by dot inversion.
Figure 14:
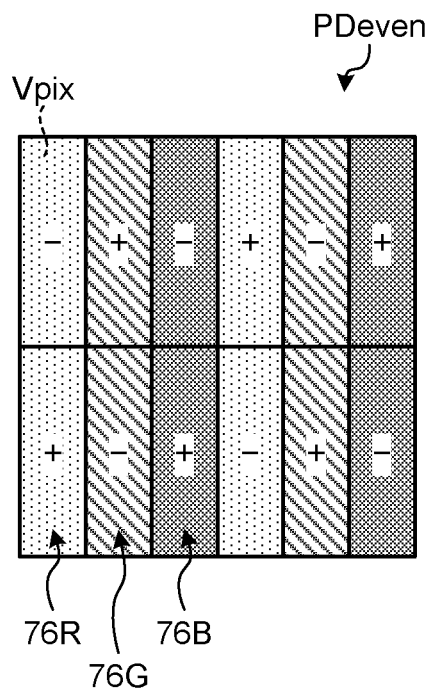
FIG. 14 is a schematic diagram for explaining the display area driven by the dot inversion.
Figure 15:
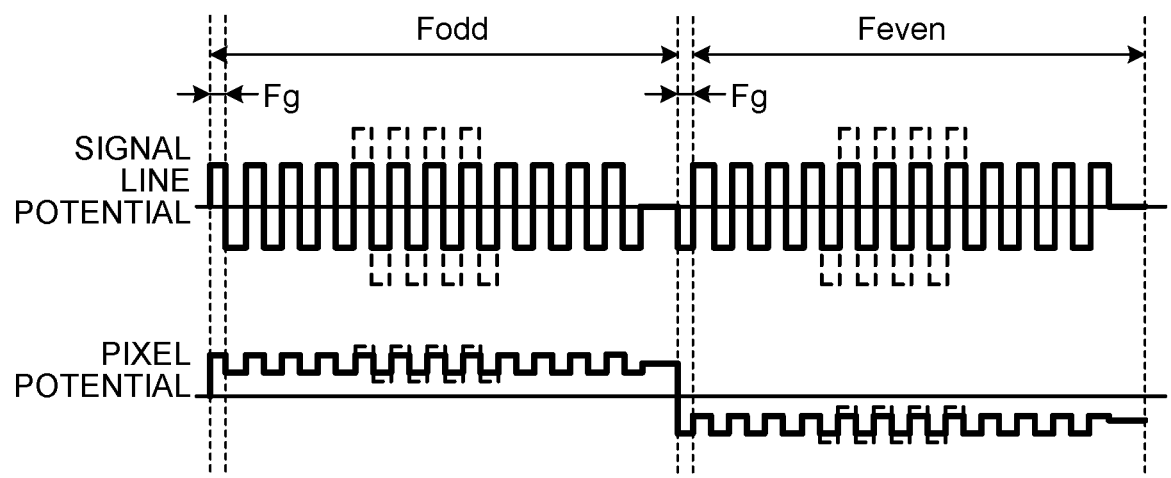
FIG. 15 is a schematic diagram for explaining a relation between the signal line potential and the pixel potential when the dot inversion driving is performed.

FIGS. 13 and 14 are schematic diagrams for explaining the display area driven by the dot inversion. FIG. 15 is a schematic diagram for explaining a relation between the signal line potential and the pixel potential when the dot inversion driving is performed. The dot inversion driving method is a driving method in which the polarity of the video signal is alternately inverted between pixels adjacent in up-down and left-right directions. The dot inversion driving alternately repeats an application state PDodd illustrated in FIG. 13 and an application state PDeven illustrated in FIG. 14.

As illustrated in FIG. 15, the period Fodd of the application state PDodd illustrated in FIG. 13 and the period Feven of the application state PDeven illustrated in FIG. 14 are alternately repeated with the writing period Fg as a border therebetween. Suppose, as illustrated in FIG. 12, the window image 21w having a high luminance is displayed in the center of the display area 21. As illustrated in FIG. 15, the polarity inversion period of the pixel potential substantially coincides with the period Fodd and the period Feven. However, the polarity inversion period of the signal line potential substantially coincides with one horizontal period and is shorter than one frame period. This equalizes the signal line average potential in one frame period of each of the period Fodd and the period Feven, resulting in a tendency that the potential difference is difficult to occur depending on whether or not the window image 21w is displayed. This leads to a result that the parasitic capacitance acting from the signal line 25 via the pedestal wiring 90 causes a smaller change in effective potential for one frame of the pixel potential depending on whether or not the window image 21w is displayed. In this manner, when the driving is performed by the column inversion driving method, the display device 1 according to the first embodiment reduces the parasitic capacitance acting from the signal line 25 via the pedestal wiring 90, and thereby can suppress the change in the pixel potential variation amount Egv for one frame of the pixel potential depending on whether or not the window image 21w is displayed. The display device 1 can suppress power consumption more by using the column inversion driving than by using the dot inversion driving.

1-1C. First Modification of First Embodiment

Figure 16:
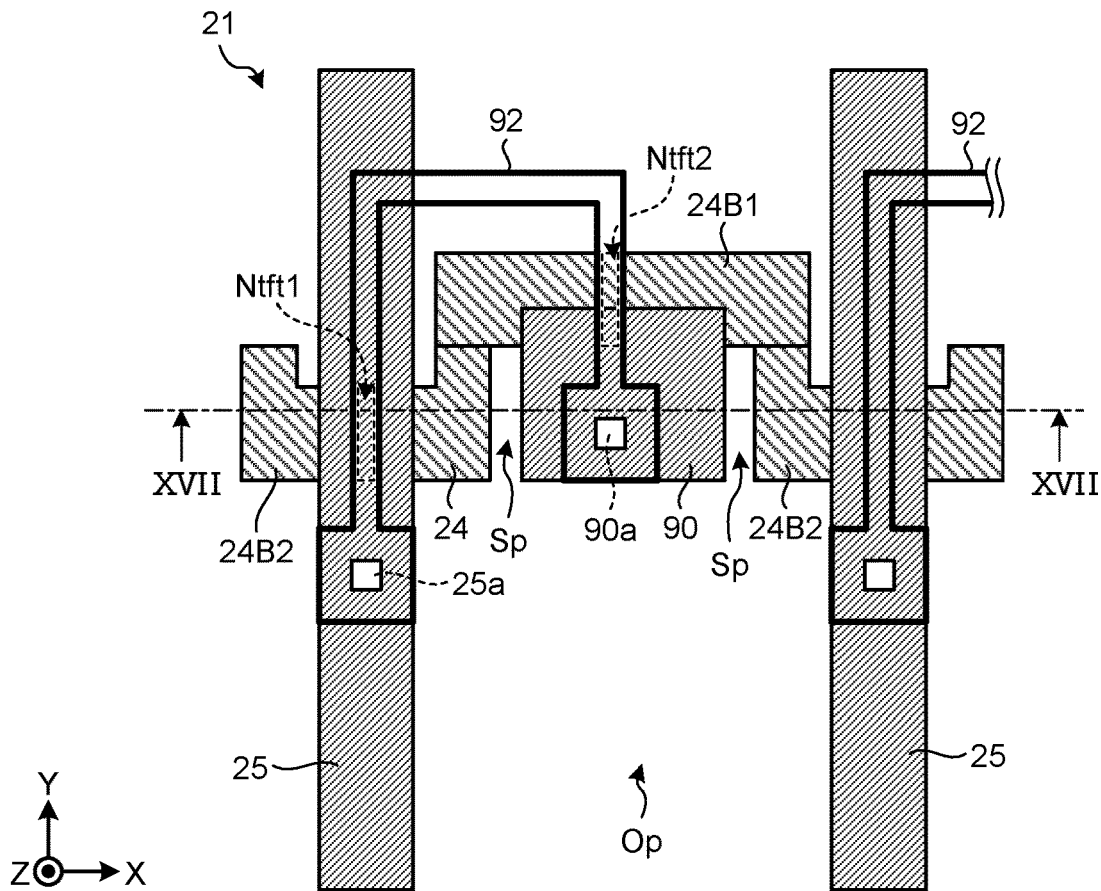
FIG. 16 is a schematic diagram for explaining a circuit pattern of the liquid crystal display panel according to a first modification of the first embodiment.
Figure 17:
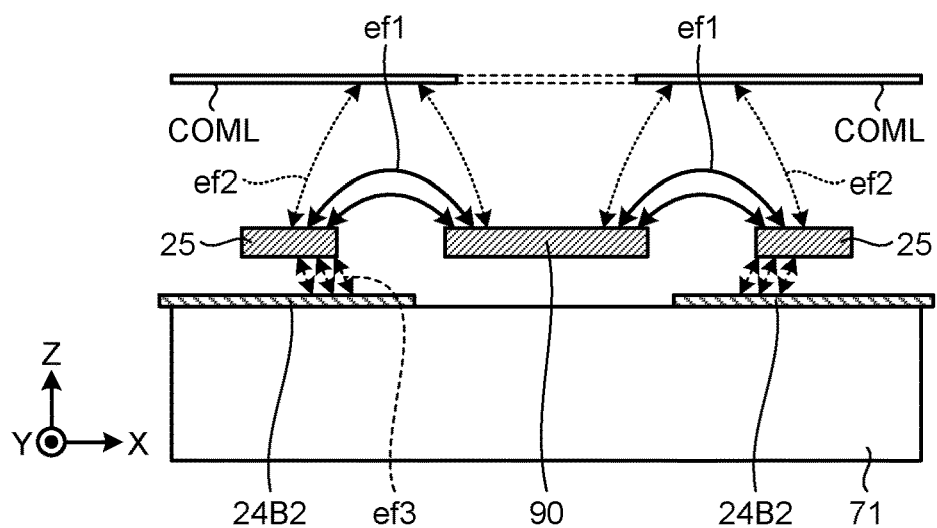
FIG. 17 is a schematic diagram of the lines of electric force in XVII-XVII line sectional view of FIG. 16.

FIG. 16 is a schematic diagram for explaining a circuit pattern of the liquid crystal display panel according to a first modification of the first embodiment. FIG. 17 is a schematic diagram of the lines of electric force in XVII-XVII line sectional view of FIG. 16. The same constituent elements as those described in the first embodiment above will be given the same numerals, and duplicate description thereof will not be repeated.

The display area 21 according to the first modification of the first embodiment has a bottom gate structure in which the semiconductor layer 92 is disposed in a plane between the scan line 24 and the signal line 25 in the Z-direction. The display area 21 according to the first modification of the first embodiment can have a top gate structure. The scan line 24 according to the first modification of the first embodiment functions as one wiring line by being conductive between a main scan line 24B2 and a bypass portion 24B1. The first coupling portion 90a lies on the extension in the X-direction from the three-dimensional intersection of the scan line 24 and the signal line 25. Therefore, the main scan line 24B2 is segmented so as not to overlap the pedestal wiring 90 when viewed in the Z-direction. The segments of the main scan line 24B2 are coupled with each other via the bypass portion 24B1 extending in parallel in the X-direction. The bypass portion 24B1 is wiring of the same metal as that of the main scan line 24B2, and is deviated in the Y-direction from the main scan line 24B2.

The main scan line 24B2 does not overlap the opening area Op when viewed in the Z-direction. The main scan line 24B2 can suppress the reduction in the aperture ratio by avoiding overlapping the opening area Op in the Z-direction. The main scan line 24B2 partially overlaps the space Sp in the Z-direction. As illustrated in FIG. 17, the main scan line 24B2 generates the lines of electric force ef3 so that the density of the lines of electric force ef1 illustrated in FIG. 8 can be reduced similarly to the lines of electric force ef1 illustrated in FIG. 17. This suppresses the magnitude of the electric field between the pedestal wiring 90 and the signal line 25. This results in the capability of suppressing the parasitic capacitance between the pixel electrode 72 and the signal line 25.

The above-described thin-film transistor Tr is a double-gate transistor including the first channel Ntft1 serving as an n-channel and the second channel Ntft2 serving as an n-channel. The semiconductor layer 92 partially overlaps the signal line 25 and the scan line 24, and has the first channel Ntft1 in a position extending in the Y-direction. The first and the second channels Ntft1 and Ntft2 extend parallel to each other in the Y-direction. The first channel Ntft1 overlaps the main scan line 24B2, and the second channel Ntft2 overlaps the bypass portion 24B1, in the Z-direction. This structure can reduce the distance between the first and the second channels Ntft1 and Ntft2 of the thin-film transistor Tr. This, in turn, allows the display area 21 according to the first modification of the first embodiment to have a smaller distance between the signal lines 25 and thus a smaller pixel pitch, leading to a higher definition.

1-1D. Second Modification of First Embodiment

Figure 18:
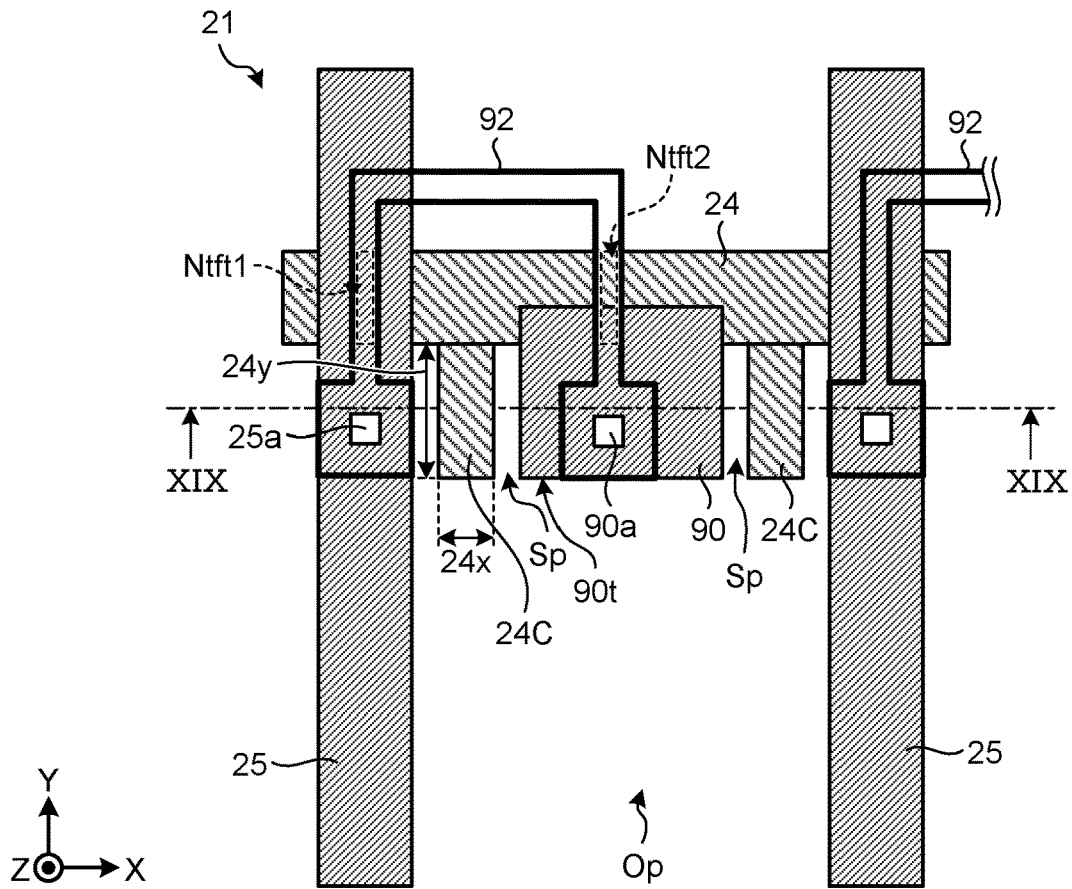
FIG. 18 is a schematic diagram for explaining a circuit pattern of the liquid crystal display panel according to a second modification of the first embodiment.
Figure 19:
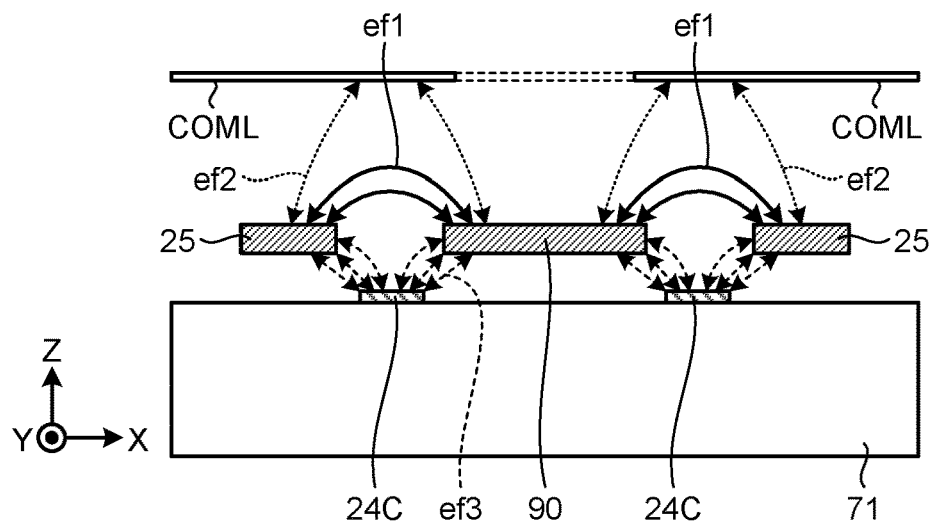
FIG. 19 is a schematic diagram of the lines of electric force in XIX-XIX line sectional view of FIG. 18.

FIG. 18 is a schematic diagram for explaining a circuit pattern of the liquid crystal display panel according to a second modification of the first embodiment. FIG. 19 is a schematic diagram of the lines of electric force in XIX-XIX line sectional view of FIG. 18. The same constituent elements as those described in the first embodiment above will be given the same numerals, and duplicate description thereof will not be repeated.

The display area 21 according to the second modification of the first embodiment has a bottom gate structure in which the semiconductor layer 92 is disposed in a plane between the scan line 24 and the signal line 25 in the Z-direction. The display area 21 according to the second modification of the first embodiment can have a top gate structure. If the length 24y exceeds the end 90t on the far side of the pedestal wiring 90 from the scan line 24, an extending portion 24C overlaps the opening area Op. This causes the extending portion 24C to shield light passing through the opening area Op, so that the extending portion 24C can reduce the aperture ratio. However, the length 24y of the extending portion 24C according to the second modification of the first embodiment projecting from the scan line 24 does not exceed the end 90t on the far side of the pedestal wiring 90 from the scan line 24. This keeps the extending portion 24C according to the second modification of the first embodiment from overlapping the opening area Op in the Z-direction. The width 24x in the X-direction of the extending portion 24C is smaller than the width in the X-direction of the space Sp. The extending portion 24C according to the second modification of the first embodiment protrudes from the scan line 24 to the space Sp without overlapping the signal line 25 in the Z-direction. This allows the extending portion 24C according to the second modification of the first embodiment to suppress the reduction in the aperture ratio by avoiding overlapping the opening area Op in the Z-direction. As described above, the extending portion 24C partially overlaps the space Sp but does not overlap the opening area Op in the Z-direction.

The extending portion 24C partially overlaps the space Sp in the Z-direction. As illustrated in FIG. 19, the extending portion 24C generates the lines of electric force ef3 so that the density of the lines of electric force ef1 illustrated in FIG. 8 can be reduced similarly to the lines of electric force ef1 illustrated in FIG. 19. This suppresses the magnitude of the electric field between the pedestal wiring 90 and the signal line 25. This results in the capability of suppressing the parasitic capacitance between the pixel electrode 72 and the signal line 25.

1-1E. Third Modification of First Embodiment

Figure 20:
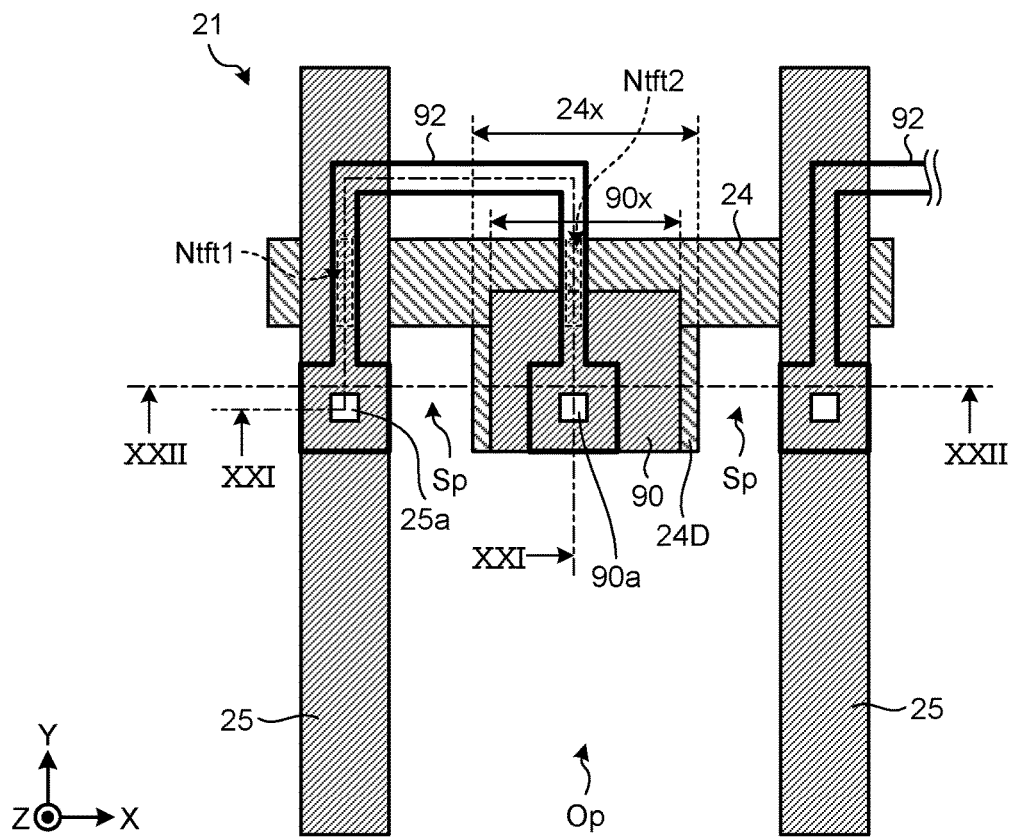
FIG. 20 is a schematic diagram for explaining a circuit pattern of the liquid crystal display panel according to a third modification of the first embodiment.
Figure 21:
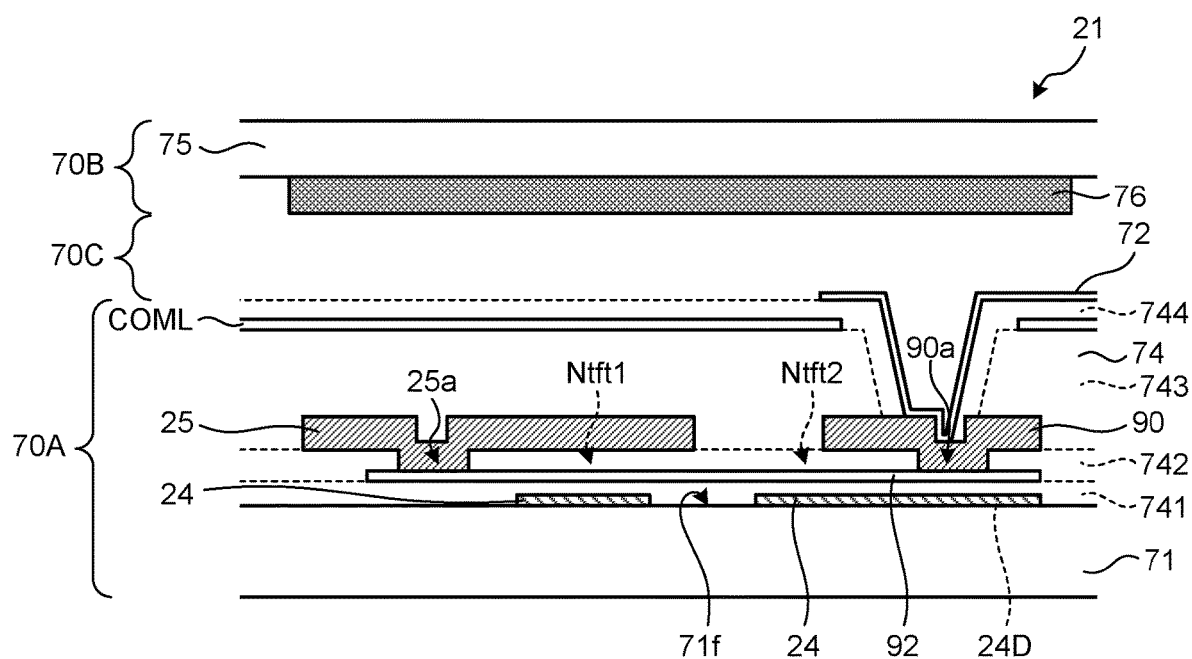
FIG. 21 is a XXI-XXI line sectional view of FIG. 20.
Figure 22:
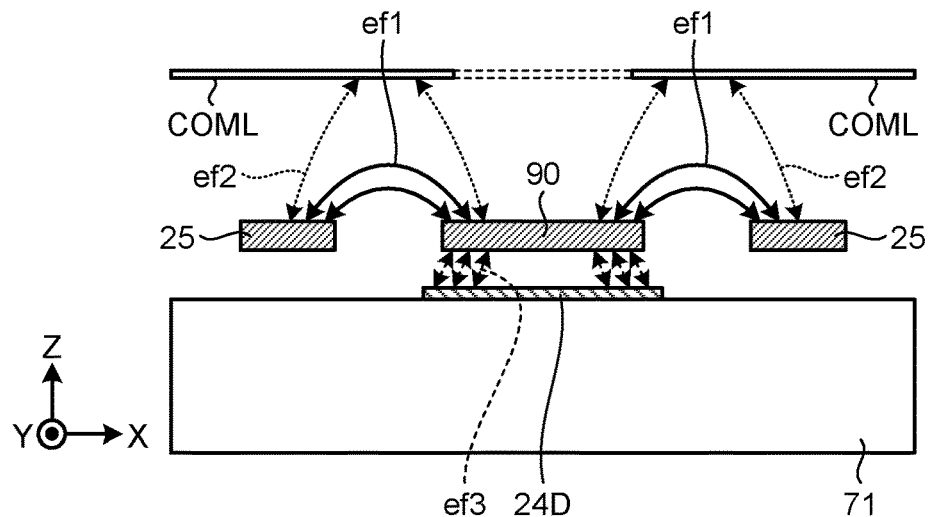
FIG. 22 is a schematic diagram of the lines of electric force in XXII-XXII line sectional view of FIG. 20.

FIG. 20 is a schematic diagram for explaining a circuit pattern of the liquid crystal display panel according to a third modification of the first embodiment. FIG. 21 is a XXI-XXI line sectional view of FIG. 20. FIG. 22 is a schematic diagram of the lines of electric force in XXII-XXII line sectional view of FIG. 20. The same constituent elements as those described in the first embodiment above will be given the same numerals, and duplicate description thereof will not be repeated.

The display area 21 according to the third modification of the first embodiment illustrated in FIGS. 20 and 21 is laminated in the Z-direction with the TFT substrate 71, the scan line 24, the semiconductor layer 92, the signal line 25, the common electrode COML, and the pixel electrode 72 in this order. The display area 21 according to the third modification of the first embodiment has a bottom gate structure in which the semiconductor layer 92 is disposed in a plane between the scan line 24 and the signal line 25 in the Z-direction. Because of the bottom gate structure, the structure of the thin-film transistor Tr allows the scan line 24 to overlap the first coupling portion 90a (i.e., drain electrode) of the pedestal wiring 90 in the Z-direction, as illustrated in FIG. 20. If the display area 21 according to the third modification of the first embodiment has a top gate structure, the structure of the thin-film transistor Tr causes a complicated structure of the scan line 24 and the first coupling portion 90a (i.e., drain electrode) of the pedestal wiring 90, such as having a bored extending portion 24D. The extending portion 24D of the scan line 24 is metal wiring provided on the same plane as a plane parallel to the surface 71f of the TFT substrate 71 on which the scan line 24 extends in the Y-direction. The extending portion 24D is an extension in the X-direction of a part of metal of the scan line 24. This causes the extending portion 24D to be electrically coupled with the scan line 24 and thus have the same potential as the scan line 24. The extending portion 24D is coupled with the gate electrode of the thin-film transistor Tr. This allows the extending portion 24D to serve as both an electric field shield and the gate electrode of the thin-film transistor Tr. This, in turn, reduces the overall layout area and improves the aperture ratio. This results in allowing the display area 21 according to the third modification of the first embodiment to support higher definition pixels.

The above-described extending portion 24D can suppress the reduction in the aperture ratio by avoiding overlapping the opening area Op in the Z-direction. As described above, the extending portion 24D partially overlaps the space Sp but does not overlap the opening area Op in the Z-direction.

The extending portion 24D has a width 24x enough to overlap the pedestal wiring 90 in the Z-direction and to protrude to the space Sp. In other words, the width 24x in the X-direction of the extending portion 24D is larger than a width 90x in the X-direction of the pedestal wiring 90. In this manner, the extending portion 24D partially overlaps the space Sp in the Z-direction. As illustrated in FIG. 22, the extending portion 24D generates the lines of electric force ef3 so that the density of the lines of electric force ef1 illustrated in FIG. 8 can be reduced similarly to the lines of electric force ef1 illustrated in FIG. 22. This suppresses the magnitude of the electric field between the pedestal wiring 90 and the signal line 25. This results in the capability of suppressing the parasitic capacitance between the pixel electrode 72 and the signal line 25.

1-2. Second Embodiment

Figure 23:
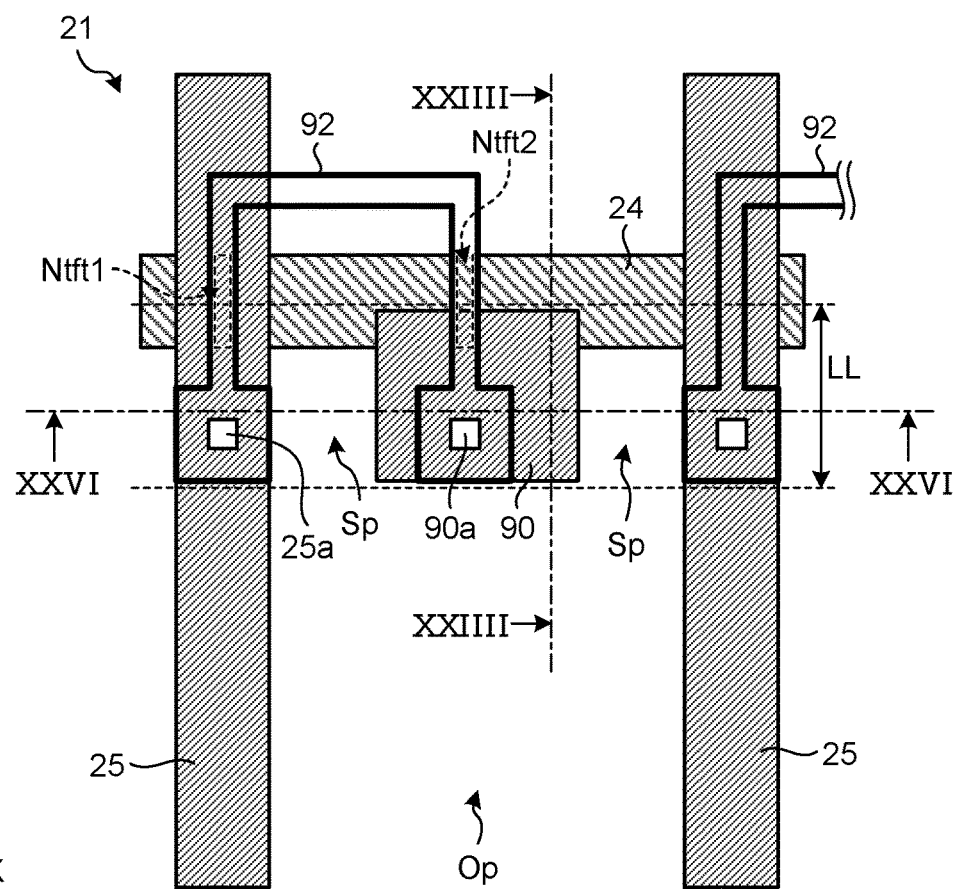
FIG. 23 is a schematic diagram for explaining a circuit pattern of the liquid crystal display panel according to the second embodiment.
Figure 24:
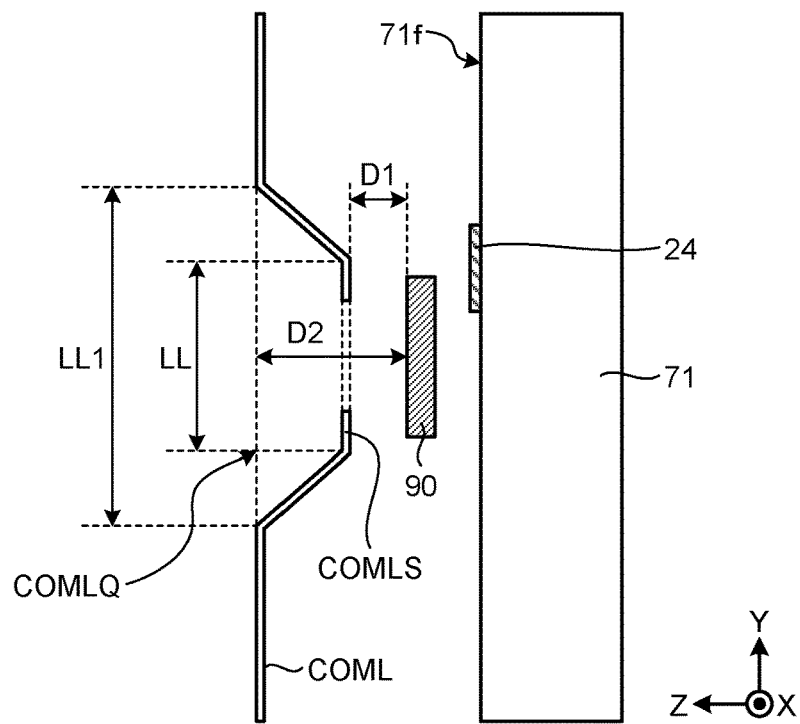
FIG. 24 is a schematic diagram schematically illustrating a structure in XXIIII-XXIIII line sectional view of FIG. 23.
Figure 25:
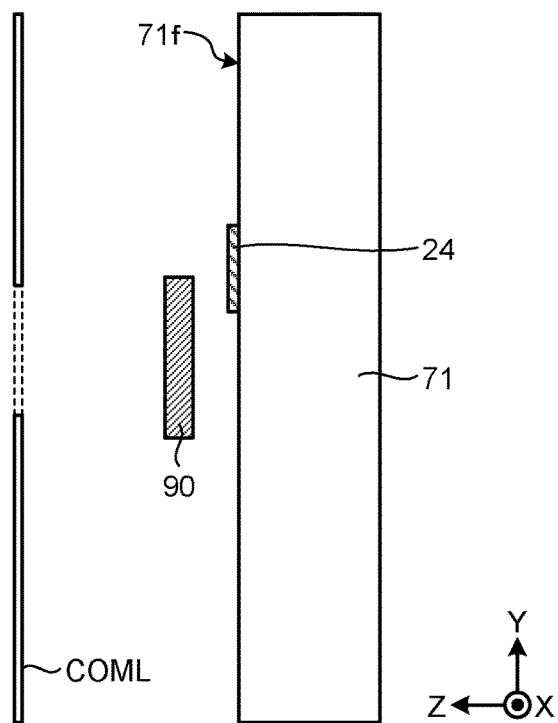
FIG. 25 is a schematic diagram schematically illustrating a structure in XXV-XXV line sectional view of FIG. 7.
Figure 26:
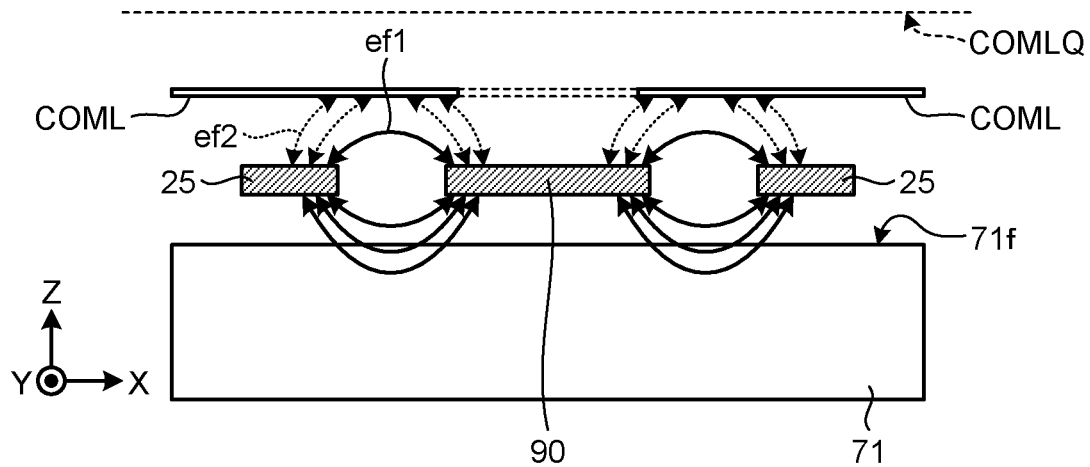
FIG. 26 is a schematic diagram of the lines of electric force in XXVI-XXVI line sectional view of FIG. 23.

FIG. 23 is a schematic diagram for explaining a circuit pattern of the liquid crystal display panel according to the second embodiment. FIG. 24 is a schematic diagram schematically illustrating a structure in XXIIII-XXIIII line sectional view of FIG. 23. FIG. 25 is a schematic diagram schematically illustrating a structure in XXV-XXV line sectional view of FIG. 7. FIG. 26 is a schematic diagram of the lines of electric force in XXVI-XXVI line sectional view of FIG. 23. The same constituent elements as those described in the first embodiment above will be given the same numerals, and duplicate description thereof will not be repeated.

The display area 21 of the display device 1 according to the second embodiment includes a depressed area COMLS of the common electrode COML formed by depressing a part of the common electrode COML toward the surface 71f of the TFT substrate 71 with respect to a reference surface COMLQ of the common electrode COML. As illustrated in FIG. 24, the depressed area COMLS overlaps the pedestal wiring 90 in the Z-direction. The depressed area COMLS has nearly the same width as a width LL in the Y-direction of the pedestal wiring 90.

As illustrated in FIG. 24, the depressed area COMLS actually includes a sloped surface, and thus often needs a width LL1 in the Y-direction somewhat larger than the width LL in the Y-direction of the pedestal wiring 90. This leads the width LL1 of the depressed area COMLS to be substantially 100% to 150% when the width LL in the Y-direction of the pedestal wiring 90 is assumed as 100%.

The depressed area COMLS is formed of the transparent conductive material of, for example, ITO, after reducing a thickness D2 of the insulation layer 74 covering the pedestal wiring 90 to a thickness D1. The thickness D1 is, for example, 0.3 μm to 1.7 μm. The thickness D2 is larger than the thickness D1, and is, for example, 1.3 μm to 2.7 μm. Thus, the thickness between the common electrode COML and the surface 71f of the TFT substrate 71 is smaller in the depressed area COMLS overlapping the pedestal wiring 90 in the Z-direction than in the opening area Op. This makes the distance between the common electrode COML and the signal line 25 or between the common electrode COML and the pedestal wiring 90 smaller than that of the display device 1 of the evaluation example illustrated in FIG. 25.

As described above, the lines of electric force ef2 are potential lines acting between the pedestal wiring 90 and the signal line 25 via the common electrode COML. The lines of electric force ef1 are potential lines directly acting between the pedestal wiring 90 and the signal line 25. A reduction in the distance between the common electrode COML and the signal line 25 or between the common electrode COML and the pedestal wiring 90 increases the density of the lines of electric force ef2. The increase in the density of the lines of electric force ef2 does not increase the parasitic capacitance between the pixel electrode 72 and the signal line 25. The increase in the density of the lines of electric force ef2 relatively reduces the density of the lines of electric force ef1. This suppresses the magnitude of the electric field between the pedestal wiring 90 and the signal line 25. This results in the capability of suppressing the parasitic capacitance between the pixel electrode 72 and the signal line 25. In the same manner as the first embodiment, when the driving is performed by the column inversion driving method, the display device 1 according to the second embodiment reduces the parasitic capacitance acting from the signal line 25 via the pedestal wiring 90, and thereby can suppress the change in the pixel potential variation amount Egv for one frame of the pixel potential depending on whether nor not the window image 21w is displayed. The display device 1 of the second embodiment can suppress the power consumption more by using the column inversion driving than by using the dot inversion driving.

1-2A. Modification of Second Embodiment

Figure 27:
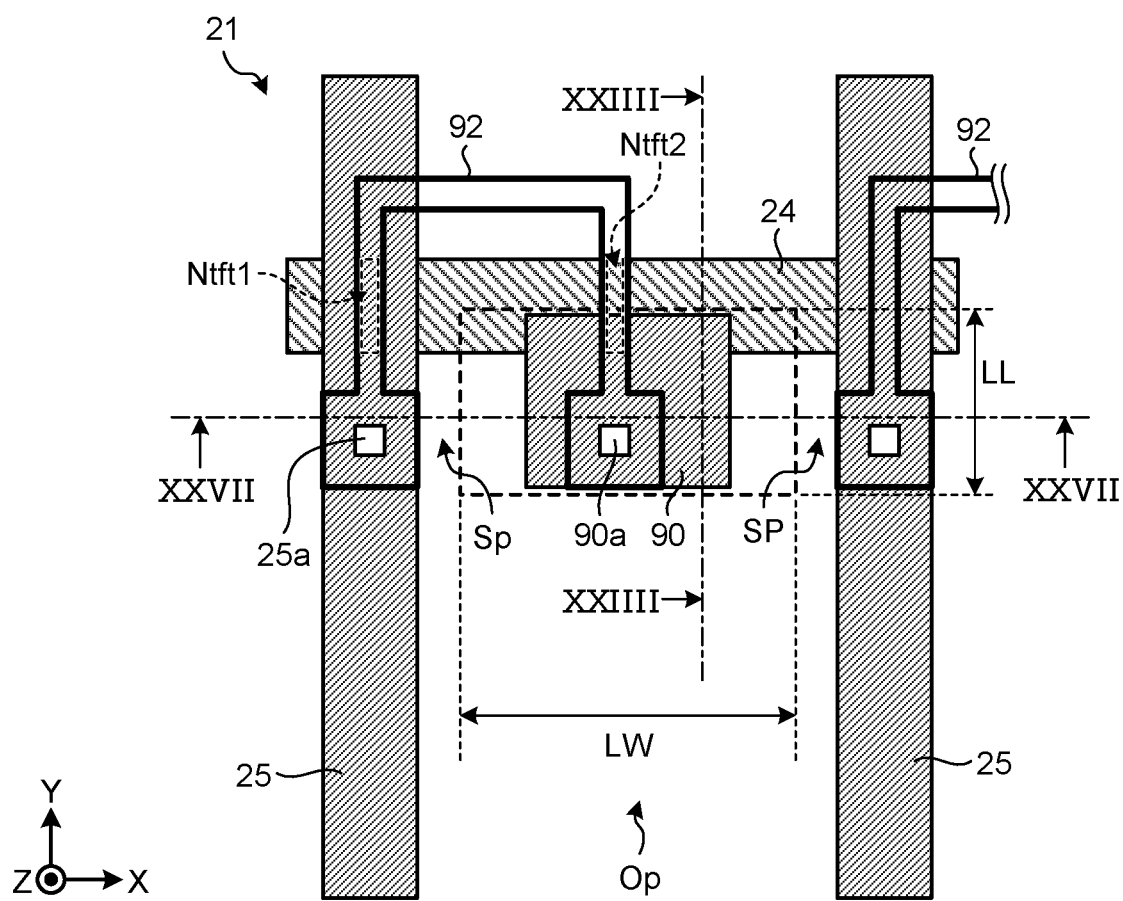
FIG. 27 is a schematic diagram for explaining a circuit pattern of the liquid crystal display panel according to a modification of the second embodiment.
Figure 28:
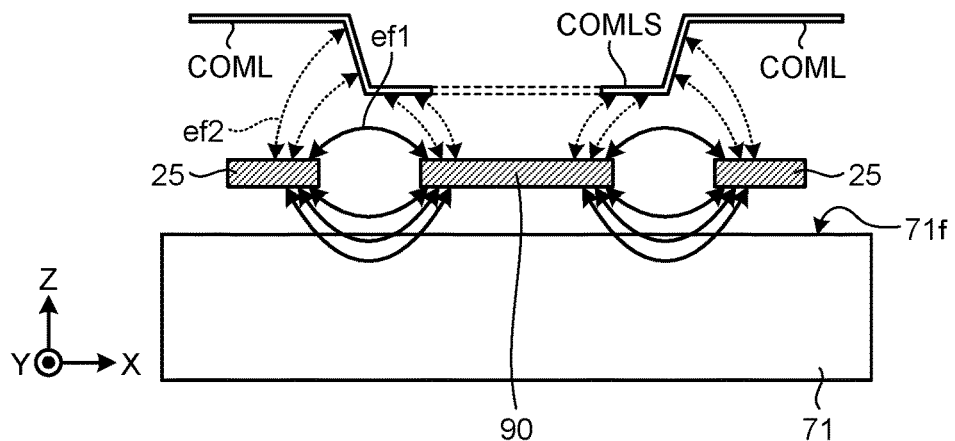
FIG. 28 is a schematic diagram of the lines of electric force in XXVII-XXVII line sectional view of FIG. 27.

FIG. 27 is a schematic diagram for explaining a circuit pattern of the liquid crystal display panel according to a modification of the second embodiment. FIG. 28 is a schematic diagram of the lines of electric force in XXVII-XXVII line sectional view of FIG. 27. The same constituent elements as those described in the first embodiment above will be given the same numerals, and duplicate description thereof will not be repeated.

The display area 21 of the display device 1 according to the modification of the second embodiment includes the depressed area COMLS of the common electrode COML formed by depressing a part of the common electrode COML toward the surface 71f of the TFT substrate 71. As illustrated in FIG. 27, the depressed area COMLS is provided in an area having the width LL in the Y-direction of the pedestal wiring 90 and a length LW in the X-direction. The length LW in the X-direction is not less than the width in the X-direction of the pedestal wiring 90, and not greater than the width between the adjacent signal lines 25. Thus, the depressed area COMLS overlaps the pedestal wiring 90 in the Z-direction as illustrated in FIG. 27. The depressed area COMLS does not overlap the signal lines 25 in the Z-direction. Thus, the thickness between the common electrode COML and the surface 71f of the TFT substrate 71 is smaller in the depressed area COMLS overlapping the pedestal wiring 90 in the Z-direction than in areas of the signal lines 25. As a result, the depressed areas COMLS suppress a possible influence of undulations transferred to the pixel electrodes 72 on optical characteristics, and can suppress the parasitic capacitance between the pixel electrodes 72 and the signal lines 25.

As illustrated in FIG. 28, a reduction in the distance between the common electrode COML and the signal line 25 or between the common electrode COML and the pedestal wiring 90 increases the density of the lines of electric force ef2. This relatively reduces the density of the lines of electric force ef1. This, in turn, suppresses the magnitude of the electric field between the pedestal wiring 90 and the signal line 25. This results in the capability of suppressing the parasitic capacitance between the pixel electrode 72 and the signal line 25. In the same manner as the first embodiment, when the driving is performed by the column inversion driving method, the display device 1 according to the modification of the second embodiment reduces the parasitic capacitance acting from the signal line 25 via the pedestal wiring 90, and thereby can suppress the change in the pixel potential variation amount Egv for one frame of the pixel potential depending on whether or not the window image 21w is displayed. The display device 1 of the modification of the second embodiment can suppress the power consumption more by using the column inversion driving than by using the dot inversion driving.

2. Application Examples

With reference to FIGS. 29 to 41, a description will be made of application examples of the display device 1 described in the embodiments. FIGS. 29 to 41 are diagrams each illustrating an example of the electronic apparatus to which the liquid crystal display panel according to any of the first and the second embodiments and the modifications thereof is applied. The display device 1 according to each of the embodiments can be applied to electronic apparatuses of all fields, such as television devices, digital cameras, notebook type personal computers, portable electronic apparatuses including mobile phones, and video cameras. In other words, the display device 1 according to each of the embodiments can be applied to electronic apparatuses of all fields that display externally received video signals or internally generated video signals as images or video pictures. The electronic apparatus includes a control device that supplies the video signals to the liquid crystal display panel, and controls operations of the liquid crystal display panel.

Application Example 1

Figure 29:
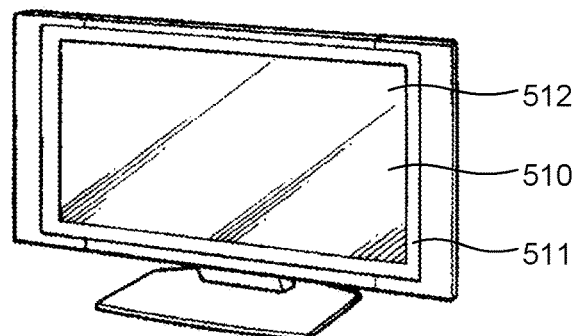
FIG. 29 is a diagram illustrating an example of an electronic apparatus to which the liquid crystal display panel according to any of the first and the second embodiments and the modifications thereof is applied.

The electronic apparatus illustrated in FIG. 29 is a television device to which the display device 1 according to either of the embodiments is applied. This television device includes, for example, a video display screen unit 510 that includes a front panel 511 and a filter glass 512. The video display screen unit 510 is the liquid crystal display panel according to any of the first and the second embodiments and the modifications thereof.

Application Example 2

Figure 30:
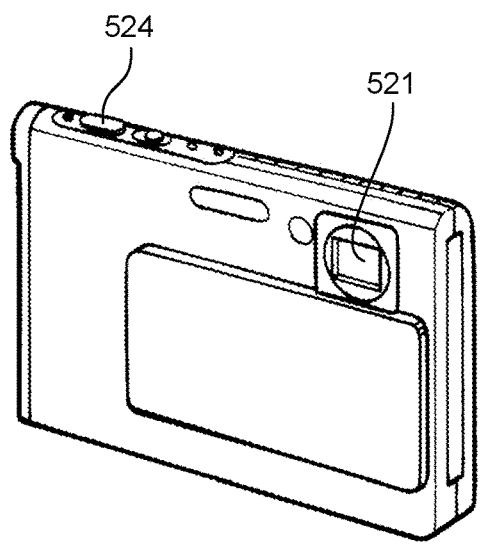
FIG. 30 is a diagram illustrating an example of an electronic apparatus to which the liquid crystal display panel according to any of the first and the second embodiments and the modifications thereof is applied.
Figure 31:
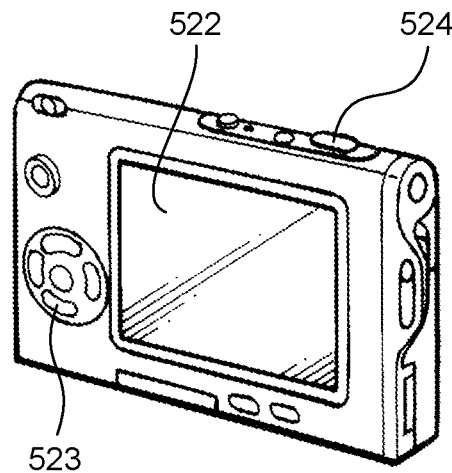
FIG. 31 is a diagram illustrating an example of an electronic apparatus to which the liquid crystal display panel according to any of the first and the second embodiments and the modifications thereof is applied.

The electronic apparatus illustrated in FIGS. 30 and 31 is a digital camera to which the display device 1 according to either of the embodiments is applied. This digital camera includes, for example, a light-emitting unit 521 for flash, a display unit 522, a menu switch 523, and a shutter button 524. The display unit 522 is the liquid crystal display panel according to any of the first and the second embodiments and the modifications thereof.

Application Example 3

Figure 32:
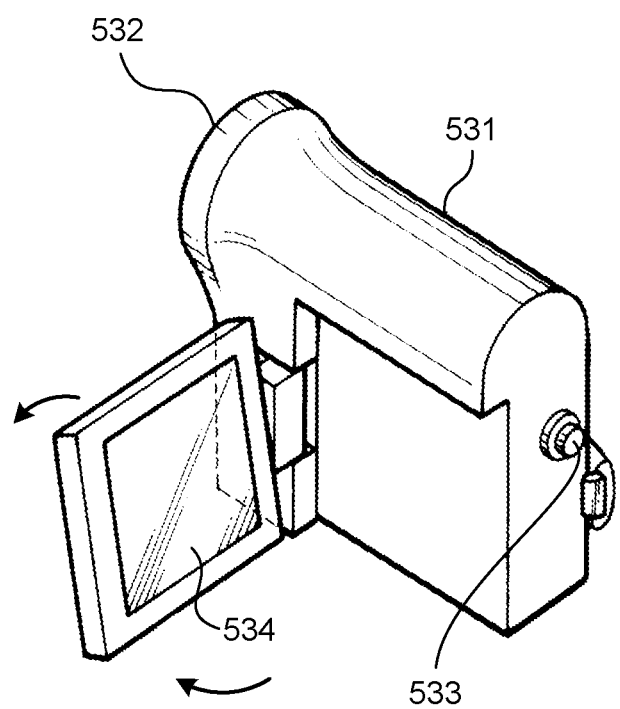
FIG. 32 is a diagram illustrating an example of an electronic apparatus to which the liquid crystal display panel according to any of the first and the second embodiments and the modifications thereof is applied.

The electronic apparatus illustrated in FIG. 32 represents an external appearance of a video camera to which the display device 1 according to either of the embodiments is applied. This video camera includes, for example, a body 531, a lens 532 for capturing a subject provided on the front side face of the body 531, and a start/stop switch 533 for capturing, and a display unit 534. The display unit 534 is the liquid crystal display panel according to any of the first and the second embodiments and the modifications thereof.

Application Example 4

Figure 33:
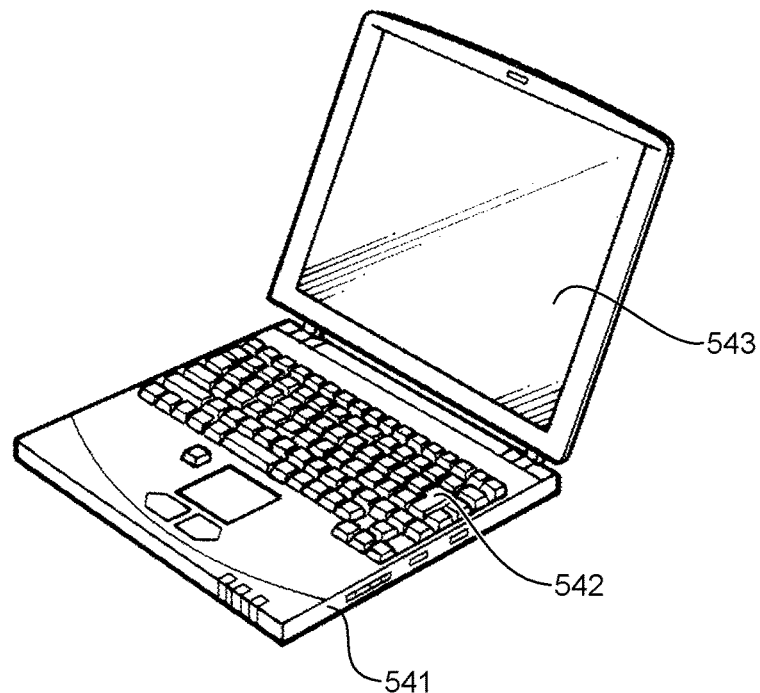
FIG. 33 is a diagram illustrating an example of an electronic apparatus to which the liquid crystal display panel according to any of the first and the second embodiments and the modifications thereof is applied.
Figure 34:
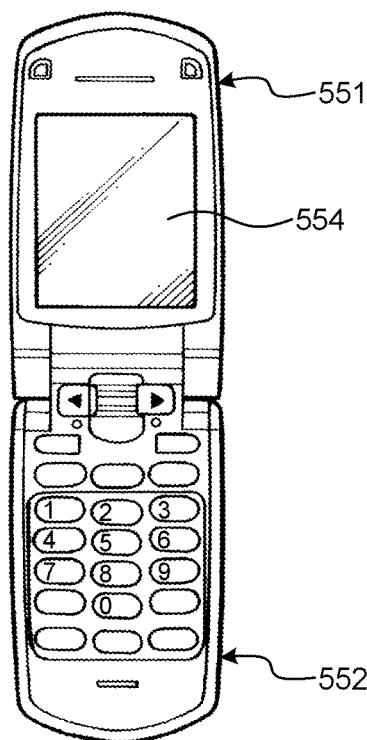
FIG. 34 is a diagram illustrating an example of an electronic apparatus to which the liquid crystal display panel according to any of the first and the second embodiments and the modifications thereof is applied.
Figure 35:
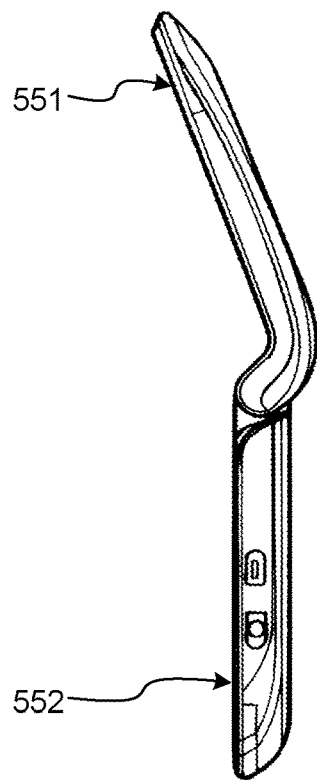
FIG. 35 is a diagram illustrating an example of an electronic apparatus to which the liquid crystal display panel according to any of the first and the second embodiments and the modifications thereof is applied.
Figure 36:
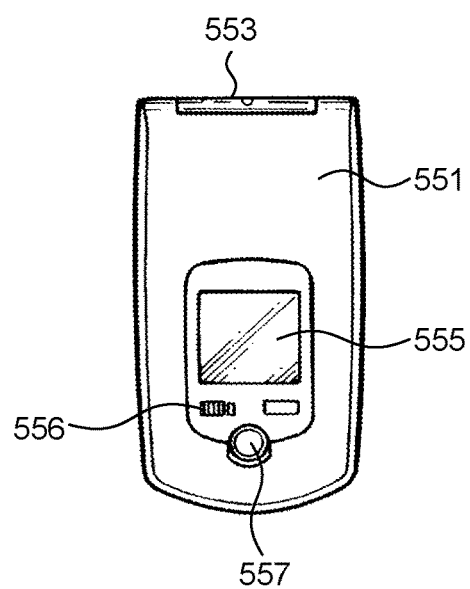
FIG. 36 is a diagram illustrating an example of an electronic apparatus to which the liquid crystal display panel according to any of the first and the second embodiments and the modifications thereof is applied.
Figure 37:
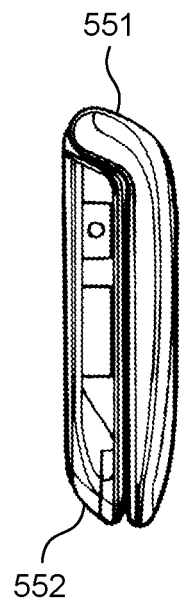
FIG. 37 is a diagram illustrating an example of an electronic apparatus to which the liquid crystal display panel according to any of the first and the second embodiments and the modifications thereof is applied.
Figure 38:
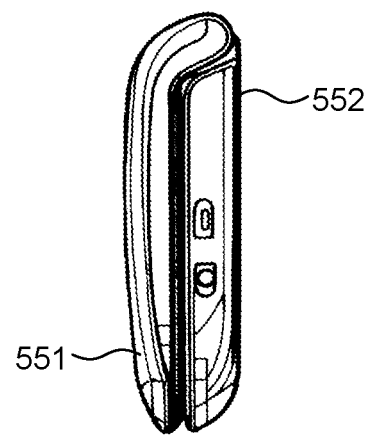
FIG. 38 is a diagram illustrating an example of an electronic apparatus to which the liquid crystal display panel according to any of the first and the second embodiments and the modifications thereof is applied.
Figure 39:
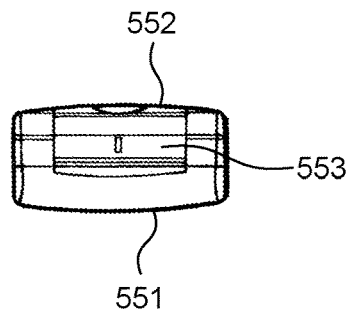
FIG. 39 is a diagram illustrating an example of an electronic apparatus to which the liquid crystal display panel according to any of the first and the second embodiments and the modifications thereof is applied.
Figure 40:
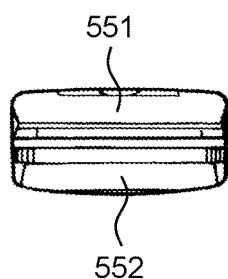
FIG. 40 is a diagram illustrating an example of an electronic apparatus to which the liquid crystal display panel according to any of the first and the second embodiments and the modifications thereof is applied.

The electronic apparatus illustrated in FIG. 33 is a notebook type personal computer to which the display device 1 according to either of the embodiments is applied. This notebook type personal computer includes, for example, a body 541, a keyboard 542 for input operation of characters and the like, and a display unit 543 that displays images. The display unit 543 is the liquid crystal display panel according to any of the first and the second embodiments and the modifications thereof.

Application Example 5

The electronic apparatus illustrated in FIGS. 34 to 40 is a mobile phone to which the display device 1 according to either of the embodiments is applied. This mobile phone is, for example, composed of an upper housing 551 and a lower housing 552 connected to each other by a connection unit (hinge unit) 553, and includes a display 554, a subdisplay 555, a picture light 556, and a camera 557. The display 554 and/or the subdisplay 555 are each the liquid crystal display panel according to any of the first and the second embodiments and the modifications thereof.

Application Example 6

Figure 41:
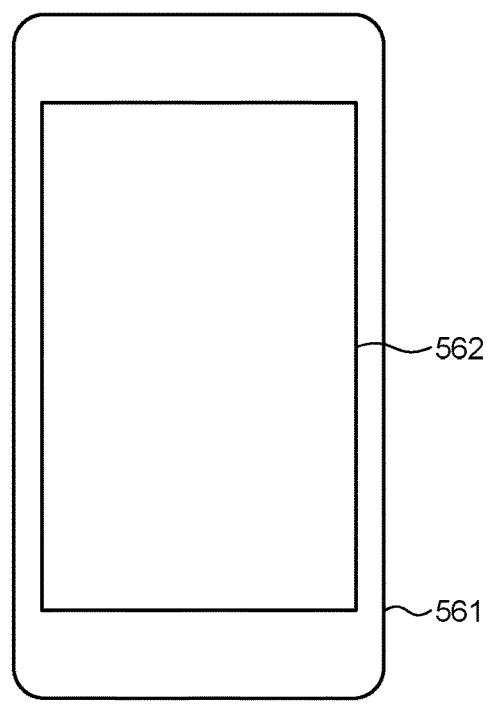
FIG. 41 is a diagram illustrating an example of an electronic apparatus to which the liquid crystal display panel according to any of the first and the second embodiments and the modifications thereof is applied.

The electronic apparatus illustrated in FIG. 41 is a portable information terminal that operates as a portable computer, a multifunctional mobile phone, a portable computer with voice call capability, or a portable computer with communication capability, and that is sometimes called a smartphone or a tablet computer. This portable information terminal includes, for example, a display unit 562 on a surface of a housing 561. The display unit 562 is the liquid crystal display panel according to any of the first and the second embodiments and the modifications thereof. The display unit 562 includes what is called a touch panel that detects an object near the liquid crystal display panel.

3. Aspects of Present Disclosure

The present disclosure includes the following aspects.

(1) A liquid crystal display panel comprising:
a first substrate;
a second substrate disposed so as to face the first substrate; and
a liquid crystal layer interposed between the first and the second substrates, wherein
the first substrate comprises:
  a plurality of pixel electrodes arranged in a matrix;
  thin-film transistors, coupled to the pixel electrodes at a first coupling portion;
  a plurality of first metal wiring lines, each of which lies in a layer different from a semiconductor layer of the thin-film transistor in a direction orthogonal to a surface of the first substrate, and three-dimensionally crosses some parts of the semiconductor layer, and serves as a scan line;
  a plurality of second metal wiring lines, each of which extends in a second direction different from a first direction of extension of the first metal wiring lines so as to three-dimensionally cross the first metal wiring lines, and is coupled to a second coupling portion of the thin-film transistor, and serves as a signal line;
  third metal wiring that is disposed in a plane including the second metal wiring lines and being parallel to the surface of the first substrate, and is coupled to the first coupling portion between the adjacent second metal wiring lines;
  an insulation layer that insulates the first metal wiring lines, the second metal wiring lines, and the third metal wiring from each other; and
  extending portions, each of which is an extension in the second direction of a part of metal of the first metal wiring lines, and
each of the extending portions extends to a length not exceeding an end on the far side of the third metal wiring from the first metal wiring lines, and a part of the extending portions is disposed in a position overlapping a space between the third metal wiring and the second metal wiring lines in the direction orthogonal to the surface of the first substrate.

(2) The liquid crystal display panel according to (1), wherein the extending portions do not overlap the second metal wiring lines in the direction orthogonal to the surface of the first substrate.

(3) The liquid crystal display panel according to (1), wherein each of the extending portions has a width large enough to overlap the second metal wiring line in the direction orthogonal to the surface of the first substrate and to protrude from the second metal wiring line to the space.

(4) The liquid crystal display panel according to (1), wherein the semiconductor layer is disposed in a plane between the first metal wiring lines and the second metal wiring lines in the direction orthogonal to the surface of the first substrate.

(5) The liquid crystal display panel according to (1), wherein each of the extending portions has a width large enough to overlap the third metal wiring in the direction orthogonal to the surface of the first substrate and to protrude to the space between the third metal wiring and the second metal wiring lines.

(6) The liquid crystal display panel according to (1), wherein the extending portions have the same electric potential as that of the scan line.

(7) The liquid crystal display panel according to (1), wherein the thin-film transistor is a double-gate transistor including a first channel and a second channel, and the first and the second channels extend parallel to each other.

(8) A liquid crystal display panel comprising a first substrate, a second substrate disposed so as to face the first substrate, and a liquid crystal layer interposed between the first and the second substrates, wherein the first substrate comprises:
- a plurality of pixel electrodes arranged in a matrix;
- a transparent common electrode provided nearer to a surface of the first substrate than to the pixel electrodes;
- thin-film transistors, coupled to the pixel electrodes at a first coupling portion;
- a plurality of first metal wiring lines, each of which lies in a layer different from a semiconductor layer of the thin-film transistor in a direction orthogonal to the surface of the first substrate, and three-dimensionally crosses some parts of the semiconductor layer, and serves as a scan line;
- a plurality of second metal wiring lines, each of which extends in a second direction different from a first direction of extension of the first metal wiring lines so as to three-dimensionally cross the first metal wiring lines, and is coupled to a second coupling portion, and serves as a signal line;
- third metal wiring that is disposed in a plane including the second metal wiring lines and being parallel to the surface of the first substrate, and is coupled to the first coupling portion between the adjacent second metal wiring lines; and
- an insulation layer that insulates the common electrode, the first metal wiring lines, the second metal wiring lines, and the third metal wiring from each other, and a thickness between the common electrode and the surface of the first substrate is smaller in an area overlapping the third metal wiring in the direction orthogonal to the surface of the first substrate than in an area not occupied by the third metal wiring between the adjacent second metal wiring lines.

(9) The liquid crystal display panel according to (8), wherein the thickness between the common electrode and the surface of the first substrate is smaller in the area overlapping the third metal wiring in the direction orthogonal to the surface of the first substrate than in an area overlapping the second metal wiring line.

(10) A liquid crystal display panel comprising a first substrate, a second substrate disposed so as to face the first substrate, and a liquid crystal layer interposed between the first and the second substrates, wherein the first substrate comprises:
- a plurality of pixel electrodes arranged in a matrix;
- thin-film transistors, coupled to the pixel electrodes at a first coupling portion;
- a plurality of first metal wiring lines, each of which lies in a layer different from a semiconductor layer of the thin-film transistor in a direction orthogonal to a surface of the first substrate, and three-dimensionally crosses some parts of the semiconductor layer, and serves as a scan line;
- a plurality of second metal wiring lines, each of which extends in a second direction different from a first direction of extension of the first metal wiring lines so as to three-dimensionally cross the first metal wiring lines, and is coupled to a second coupling portion of the thin-film transistor, and serves as a signal line;
- third metal wiring that is disposed in a plane including the second metal wiring lines and being parallel to the surface of the first substrate, and is coupled to the first coupling portion between the adjacent second metal wiring lines;
- an insulation layer that insulates the first metal wiring lines, the second metal wiring lines, and the third metal wiring from each other; and
- bypass portions of the first metal wiring lines, each of the bypass portions bypassing, through a position deviated in the second direction, the first coupling portion lying on a line extended in the first direction of extension of the first metal wiring line from the intersection where the first metal wiring line and the second metal wiring line three-dimensionally cross each other in a separate manner in the direction orthogonal to the first substrate.

(11) The liquid crystal display panel according to (10), wherein the thin-film transistor is a double-gate transistor including a first channel and a second channel, and the first and the second channels extend parallel to each other, and overlap the first metal wiring line and the bypass portion, respectively, in the direction orthogonal to the first substrate.

(12) An electronic apparatus comprising a liquid crystal display panel, wherein
the liquid crystal display panel comprises a first substrate, a second substrate disposed so as to face the first substrate, and a liquid crystal layer interposed between the first and the second substrates,
the first substrate comprises:
- a plurality of pixel electrodes arranged in a matrix;
- thin-film transistors, coupled to the pixel electrodes at a first coupling portion;
- a plurality of first metal wiring lines, each of which lies in a layer different from a semiconductor layer of the thin-film transistor in a direction orthogonal to a surface of the first substrate, and three-dimensionally crosses some parts of the semiconductor layer, and serves as a scan line;
- a plurality of second metal wiring lines, each of which extends in a second direction different from a first direction of extension of the first metal wiring lines so as to three-dimensionally cross the first metal wiring lines, and is coupled to a second coupling portion of the thin-film transistor, and serves as a signal line;
- third metal wiring that is disposed in a plane including the second metal wiring lines and being parallel to the surface of the first substrate, and is coupled to the first coupling portion between the adjacent second metal wiring lines;
- an insulation layer that insulates the first metal wiring lines, the second metal wiring lines, and the third metal wiring from each other; and
- extending portions, each of which is an extension in the second direction of a part of metal of the first metal wiring lines, and each of the extending portions extends to a length not exceeding an end on the far side of the third metal wiring from the first metal wiring lines, and a part of the extending portions is disposed in a position overlapping a space between the third metal wiring and the second metal wiring lines in the direction orthogonal to the surface of the first substrate.

(13) An electronic apparatus comprising a liquid crystal display panel, wherein
the liquid crystal display panel comprises a first substrate, a second substrate disposed so as to face the first substrate, and a liquid crystal layer interposed between the first and the second substrates,
the first substrate comprises:
  a plurality of pixel electrodes arranged in a matrix;
  a transparent common electrode provided nearer to a surface of the first substrate than to the pixel electrodes;
  thin-film transistors, coupled to the pixel electrodes at a first coupling portion;
  a plurality of first metal wiring lines, each of which lies in a layer different from a semiconductor layer of the thin-film transistor in a direction orthogonal to the surface of the first substrate, and three-dimensionally crosses some parts of the semiconductor layer, and serves as a scan line;
  a plurality of second metal wiring lines, each of which extends in a second direction different from a first direction of extension of the first metal wiring lines so as to three-dimensionally cross the first metal wiring lines, and is coupled to a second coupling portion of the thin-film transistor, and serves as a signal line;
  third metal wiring that is disposed in a plane including the second metal wiring lines and being parallel to the surface of the first substrate, and is coupled to the first coupling portion between the adjacent second metal wiring lines; and
  an insulation layer that insulates the common electrode, the first metal wiring lines, the second metal wiring lines, and the third metal wiring from each other, and
a thickness between the common electrode and the surface of the first substrate is smaller in an area overlapping the third metal wiring in the direction orthogonal to the surface of the first substrate than in an area not occupied by the third metal wiring between the adjacent second metal wiring lines.

(14) An electronic apparatus comprising a liquid crystal display panel, wherein
the liquid crystal display panel comprises a first substrate, a second substrate disposed so as to face the first substrate, and a liquid crystal layer interposed between the first and the second substrates, and
the first substrate comprises:
  a plurality of pixel electrodes arranged in a matrix;
  thin-film transistors, coupled to the pixel electrodes at a first coupling portion;
  a plurality of first metal wiring lines, each of which lies in a layer different from a semiconductor layer of the thin-film transistor in a direction orthogonal to a surface of the first substrate, and three-dimensionally crosses some parts of the semiconductor layer, and serves as a scan line;
  a plurality of second metal wiring lines, each of which extends in a second direction different from a first direction of extension of the first metal wiring lines so as to three-dimensionally cross the first metal wiring lines, and is coupled to a second coupling portion of the thin-film transistor, and serves as a signal line;
  third metal wiring that is disposed in a plane including the second metal wiring lines and being parallel to the surface of the first substrate, and is coupled to the first coupling portion between the adjacent second metal wiring lines;
  an insulation layer that insulates the first metal wiring lines, the second metal wiring lines, and the third metal wiring from each other; and
  bypass portions of the first metal wiring lines, each of the bypass portions being coupled with the first metal wiring line and parallel to the first metal wiring line, and bypassing the first coupling portion lying on a line extended in the direction of extension of the first metal wiring line from the intersection where the first metal wiring line and the second metal wiring line three-dimensionally cross each other in a separate manner in the direction orthogonal to the first substrate.

According to an aspect of the present disclosure, provided are a liquid crystal display panel and an electronic apparatus that suppress parasitic capacitance acting between wiring and pixels, and suppress a reduction in aperture ratio.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

What is claimed is:
1. A liquid crystal display comprising:
  a first substrate;
  a second substrate disposed so as to face the first substrate;
  a liquid crystal layer interposed between the first and the second substrates;
  a pixel electrode on the first substrate;
  a metal layer being coupled to the pixel electrode;
  a U-shaped semiconductor layer being coupled to the metal layer at a first coupling portion;
  a scan line that extends in a first direction on the first substrate;
  a signal line that extends in a second direction different from the first direction so as to three-dimensionally cross the scan line, the signal line being coupled to the semiconductor layer at a second coupling portion; and
  an extending portion that is a part of the scan line and that protrudes from the scan line, the extending portion extending along the signal line,
wherein:
  the metal layer is disposed in the same layer as the signal line,
  in the first direction that is along a shorter side of each pixel unit, the extending portion is adjacent to the metal layer, and
  in the second direction that is along a longer side of each pixel unit, a length of the extending portion is smaller than a length of the metal layer.

2. The liquid crystal display according to claim 1, wherein a shape of the metal layer is quadrangular in a plan view.

3. The liquid crystal display according to claim 1, wherein the extending portion includes two extending regions,
  each of the extending regions is arranged between the metal layer and the signal line adjacent to the metal layer, and in the first direction, a space between the signal line and each of the extending regions is smaller than a space between each of the extending regions and the metal layer.

4. The liquid crystal display according to claim 1, wherein the extending portion partially overlaps with the signal line.

5. The liquid crystal display according to claim 1, wherein the semiconductor layer is disposed in a plane between a plane of the scan line and a plane of the signal line in a vertical direction.

6. The liquid crystal display according to claim 1, wherein the scan line three-dimensionally crosses the semiconductor layer at two portions.

7. The liquid crystal display according to claim 1, wherein the extending portion has an electric potential that is the same as an electric potential of the scan line.

8. The liquid crystal display according to claim 7, wherein
the scan line overlaps the semiconductor layer at a first portion and at a second portion, and
the first portion and the second portion are arranged parallel to each other.

* * * * *